(12) United States Patent
Okuyama et al.

(10) Patent No.: US 7,136,087 B2
(45) Date of Patent: Nov. 14, 2006

(54) MULTI-EXPOSURE DRAWING METHOD AND APPARATUS THEREFOR

(75) Inventors: Takashi Okuyama, Saitama (JP); Hiroyuki Washiyama, Tokyo (JP)

(73) Assignee: ORC Manufacturing Co., Ltd., Tokyo (JP)

( * ) Notice: Subject to any disclaimer, the term of this patent is extended or adjusted under 35 U.S.C. 154(b) by 319 days.

(21) Appl. No.: 10/188,097

(22) Filed: Jul. 3, 2002

(65) Prior Publication Data

US 2003/0011860 A1    Jan. 16, 2003

(30) Foreign Application Priority Data

Jul. 5, 2001  (JP) ............................ P2001-204550
Sep. 13, 2001  (JP) ............................ P2001-278031

(51) Int. Cl.
    *B41J 2/47*    (2006.01)
(52) U.S. Cl. ...................................... 347/239; 347/255
(58) Field of Classification Search ................ 347/135, 347/136, 234, 239–341, 248, 251–255, 142–145, 347/134; 430/396; 348/770, 771; 359/290–291, 359/298
See application file for complete search history.

(56) References Cited

U.S. PATENT DOCUMENTS 5,049,901 A    9/1991  Gelbart ..................... 347/239
6,121,984 A *  9/2000  Anderson .................. 347/135
6,251,550 B1   6/2001  Ishikawa .................... 430/22
6,537,738 B1 * 3/2003  Mei et al. .................. 430/396
6,700,597 B1 * 3/2004  Fujii ......................... 347/234

FOREIGN PATENT DOCUMENTS

JP    9-17718     1/1997
JP    10-147007   6/1998

* cited by examiner

*Primary Examiner*—Hai Pham
(74) *Attorney, Agent, or Firm*—Greenblum & Bernstein, P.L.C.

(57) ABSTRACT

In a multi-exposure drawing method for drawing a pattern on a drawing surface, using an exposure unit including a plurality of optical modulation elements arranged in both a first array-direction and a second array-direction, the exposure unit is moved in relation to the drawing surface in a drawing direction. The drawing direction is inclined to form an angle with respect to the first array-direction, whereby the exposure unit is gradually shifted in the second array-direction during the movement of the exposure unit. The modulation elements are successively and selectively operated based on pattern bit-data to thereby modulate a light beam made incident on each modulation element, whenever the exposure unit is moved in the drawing direction by a distance of "A+a". "A" is a distance corresponding to an integer-multiple of a dimension of a unit exposure zone produced on the drawing surface by each modulation element, and "a" is a smaller distance than the dimension of the unit exposure.

17 Claims, 20 Drawing Sheets

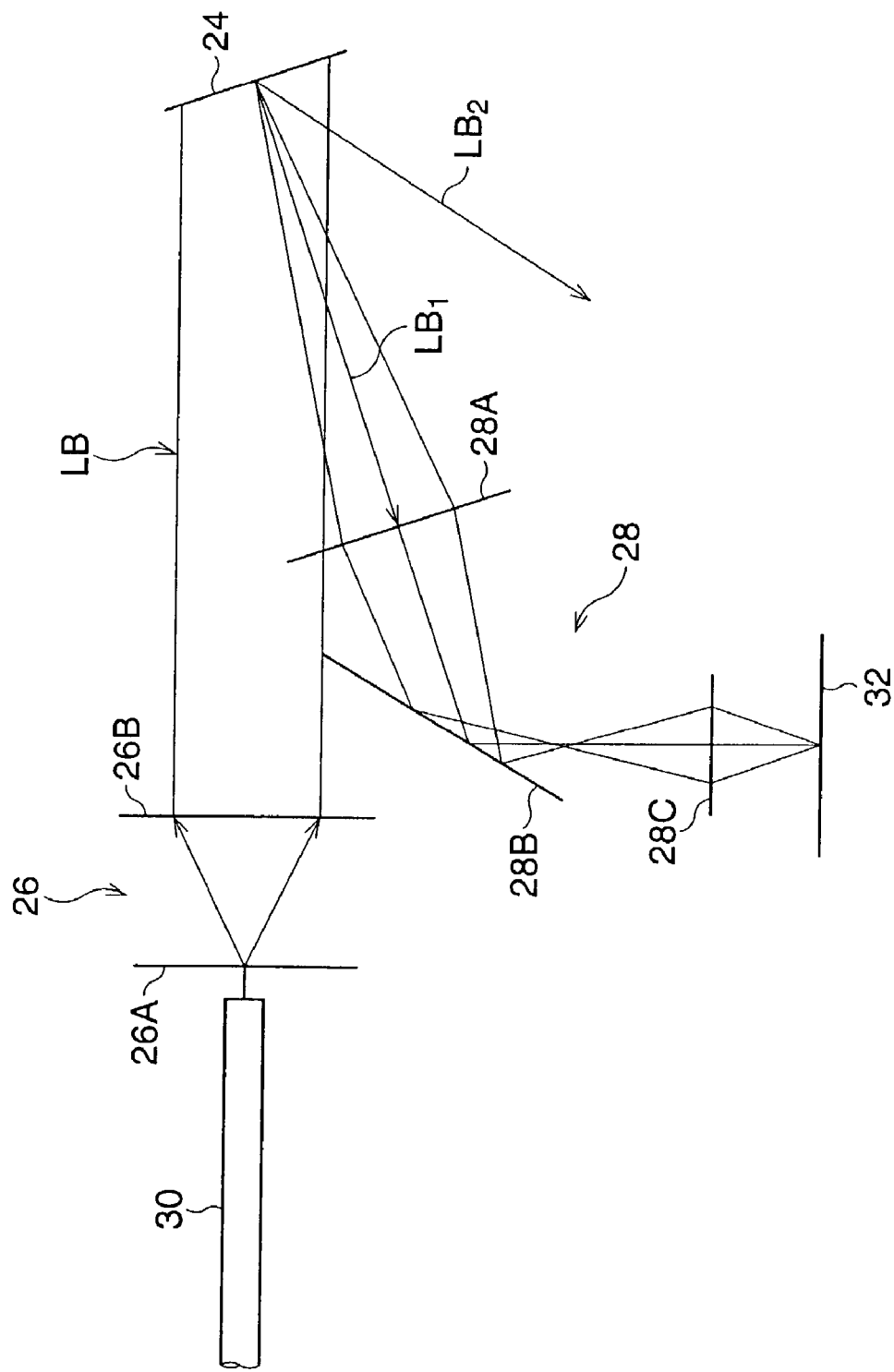

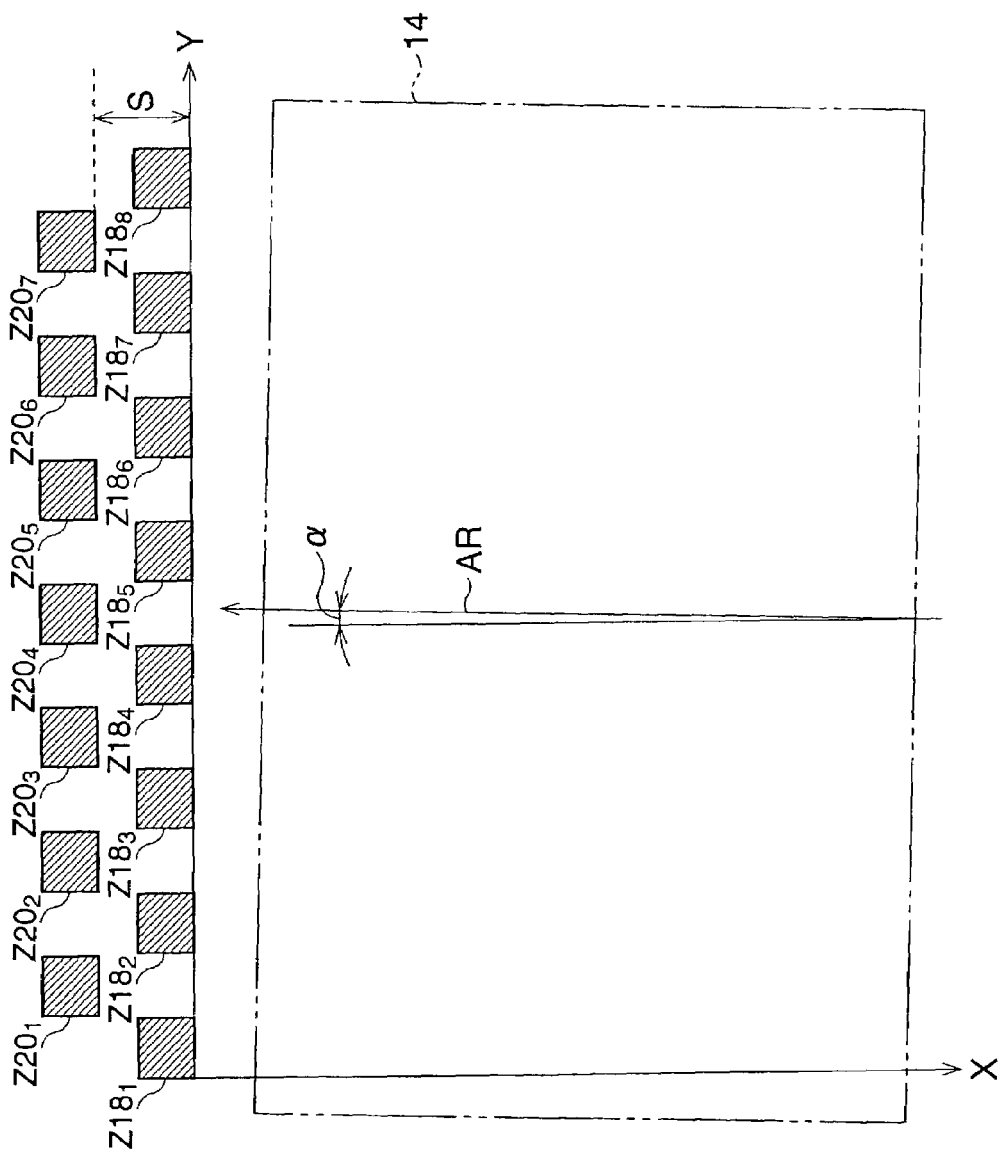

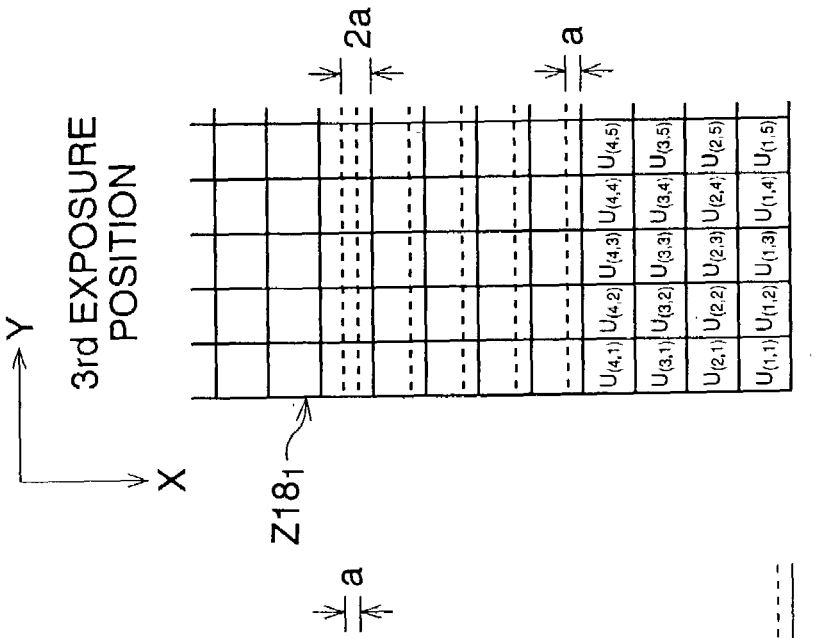
FIG. 4(C) 3rd EXPOSURE POSITION
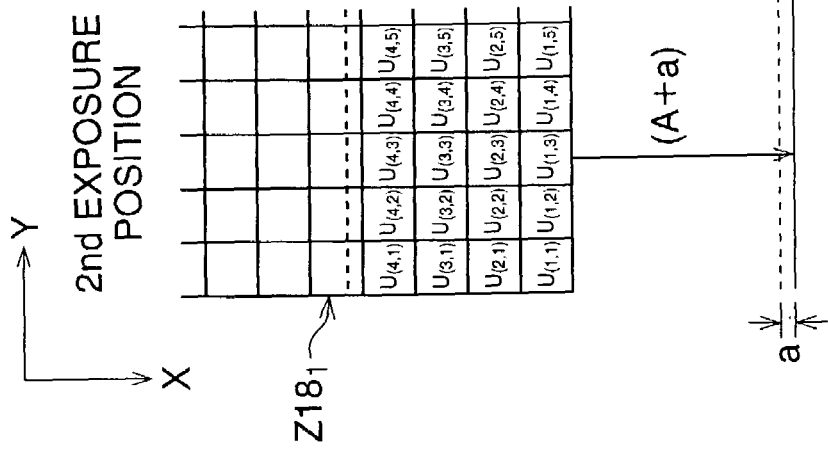
FIG. 4(B) 2nd EXPOSURE POSITION
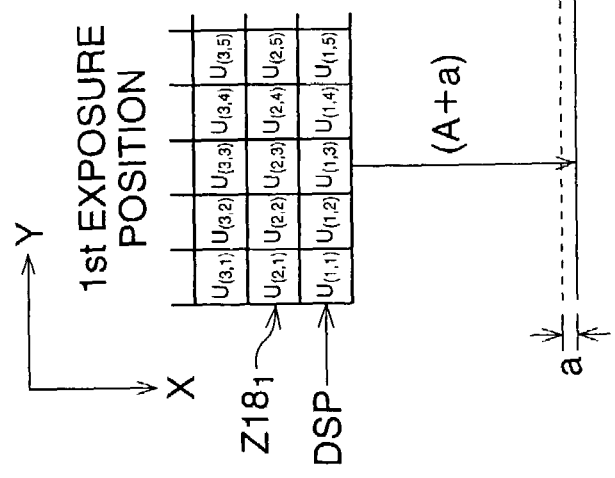
FIG. 4(A) 1st EXPOSURE POSITION

| $L_x$ \ $R_y$ | 0001 | 0002 | 0003 | ---------- | 1278 | 1279 | 1280 |
|---|---|---|---|---|---|---|---|
| 000001 | B | B | B | ---------- | B | B | B |
| 000002 | B | B | B | ---------- | B | B | B |
| 000003 | B | B | B | ---------- | B | B | B |
| 000004 | B | B | B | ---------- | B | B | B |
| 000005 | B | B | B | ---------- | B | B | B |
| 000006 | B | B | B | ---------- | B | B | B |
| ⋮ | ⋮ | ⋮ | ⋮ | ⋮ | ⋮ | ⋮ | ⋮ |

MULTI-EXPOSURE DRAWING METHOD AND APPARATUS THEREFOR

BACKGROUND OF THE INVENTION

1. Field of the Invention

The present invention relates to a drawing method for drawing a pattern on a surface of a workpiece, using an exposure unit including a plurality of optical modulation elements arranged in a matrix manner, and also relates to a drawing apparatus in which the drawing method is executed.

2. Description of the Related Art

In general, such a drawing apparatus is used for optically drawing fine patterns, characters, symbols, and so on the surface of a suitable workpiece. A representative use of the drawing apparatus is for a circuit pattern drawn on a workpiece when a printed circuit board is manufactured by using photolithography. In this case, the workpiece may be either a photosensitive film for producing a photomask or a photoresist layer formed on a suitable substrate.

Recently, circuit pattern drawing systems have been developed for efficiently carrying out the drawing of circuit patterns by integrating the use of a drawing apparatus, a CAD (Computer Aided Design) station for designing a circuit pattern, and a CAM (Computer Aided Manufacturing) station for editing the designed circuit. The drawing apparatus, the CAD stations, and the CAM station are all connected to each other through a LAN (local area network).

A circuit pattern is designed and treated as vector-graphic data by the CAD station. The vector-graphic data may be fed from the CAD station to the CAM station, through the LAN, for editing the designed circuit pattern, if necessary. The vector-graphic data is fed from either the CAD station or the CAM station to the drawing apparatus, and is stored in a storage medium, such as a hard disk, provided in the drawing apparatus.

The drawing apparatus is provided with a vector-to-raster converter, and a bit-map memory. The vector graphic data is read from the hard disk, for example, and is converted into raster-graphic data by the vector-to-raster converter. Then, the raster-graphic data are developed and stored in the bit-map memory for a drawing operation.

The drawing apparatus is further provided with an exposure unit for drawing a circuit pattern on the workpiece based on the raster-graphic data, and the exposure unit may comprise a digital micro-mirror device (DMD) unit, a liquid crystal display (LCD) array unit or the like.

As is well known, the DMD unit has a reflecting surface which is formed from a plurality of micro-mirror elements arranged in a matrix manner. Each micro-mirror element is independently driven between a first reflecting position and a second reflecting position. Thus, it is possible to divide a light beam, which is wholly made incident on the reflecting surface of the DMD unit, into a plurality of light beams by independently driving each of the micro-mirror elements between the first and second reflecting positions.

In the DMD unit assembled in the drawing apparatus, when each micro-mirror element is at the first reflecting position, it reflects the light beam such that the reflected light beam is directed toward the workpiece, and when each micro-mirror element is at the second reflecting position, it reflects the light beam such that the reflected light beam deviates from the workpiece. Thus, since each of the micro-mirror elements serves as an optical modulation element, it is possible to draw the circuit pattern on the workpiece by operating the DMD unit in accordance with the raster-graphic data read from the bit-map memory.

Also, as is well known, the LCD array unit comprises a pair of transparent plate members with a liquid crystal intervened therebetween, and plural pairs of transparent electrode elements arranged on and attached to the transparent plate members in a matrix manner so that the transparent electrode elements in each pair are registered with each other. With the arrangement of the LCD array unit, it is possible to selectively allow penetration of a light beam through each pair of transparent electrode elements by controlling application of a voltage to the electrode elements in pairs. Thus, since each pair of the transparent electrode elements also serves as an optical modulation element, the circuit pattern can be drawn on the workpiece by operating the LCD array unit in accordance with the raster-graphic data read from the bit-map memory.

Furthermore, the drawing apparatus is provided with a light source device for generating and introducing a light beam into the exposure unit. A suitable lamp, such as a light emitting diode (LED), a high-pressure mercury-vapor lamp, a xenon lamp, a flash lamp, and so on, is used in the light source device, according to the sensitivity and the optical characteristics of the photoresist layer on the workpiece.

Usually, a circuit pattern to be drawn on the workpiece has an area which is considerably larger than an exposure area obtained from an exposure unit or from several exposure units. Thus, it is necessary to scan the workpiece with at least one exposure unit before a large circuit pattern can be completely drawn on the workpiece. To this end, the drawing apparatus is provided with a movable drawing table on which the workpiece is placed. The drawing table is moved relative to the exposure unit, whereby the workpiece on the drawing table is scanned with the exposure unit.

Conventionally, a "step & repeat" method is used as a scanning method in the drawing apparatus. In particular, in the "step & repeat" method, the drawing table is intermittently moved relative to the exposure unit, so that a part of the circuit pattern is drawn on the workpiece by operating the exposure unit based on raster-graphic data during the stoppage of the drawing table, and the intermittent movement of the drawing table is continued until the circuit pattern is completely drawn.

On the other hand, a drawing apparatus comprising a laser beam scanner is also known. The laser beam scanner includes an optical laser-beam deflector for deflecting a laser beam such that a drawing table is scanned with the deflected laser beam, and a laser-beam modulator for selectively controlling the introduction of the laser beam into the optical laser-beam deflector. Thus, it is possible to draw a circuit pattern on a workpiece by operating the laser-beam modulator in accordance with the raster-graphic data.

In all cases, in the conventional drawing apparatuses, resolution of a drawn circuit pattern depends on the size of pixels (dot size), which is previously determined and fixed in each drawing apparatus. For example, in the drawing apparatus including the aforesaid exposure unit, the size of pixels is determined by the size of the optical modulation elements. Also, in the drawing apparatus including the laser beam scanner, the size of pixels is determined by the diameter of the scanning laser beam.

Accordingly, conventionally, when a circuit pattern is designed on the CAD or CAM station, it is necessary to coincide the pixel size of the circuit pattern to be designed with a pixel size determined by a drawing apparatus used. Thus, the flexibility of circuit pattern design is restricted by the drawing apparatus. In other words, various types of drawing apparatuses must be prepared and used in the aforesaid circuit pattern drawing system, before the flexibility of circuit pattern design can be increased in the CAD or CAM station.

SUMMARY OF THE INVENTION

Therefore, an object of the present invention is to provide a multi-exposure drawing method for drawing a pattern on a surface of a workpiece, using an exposure unit including a plurality of optical modulation elements arranged in a matrix manner, which is constituted such that the pattern can be properly drawn regardless of a predetermined pixel size of the pattern.

Another object of the present invention is to provide a multi-exposure drawing apparatus in which the aforesaid multi-exposure drawing method is executed.

In accordance with an aspect of the present invention, there is provided a multi-exposure drawing method for drawing a pattern on a drawing surface, using an exposure unit including a plurality of optical modulation elements arranged in both a first array-direction and a second array-direction. In the multi-exposure drawing method, the exposure unit is relatively moved in relation to the drawing surface in a drawing direction, which is inclined so as to form an angle with respect to the first array-direction, whereby the exposure unit is gradually shifted in the second array-direction during the movement of the exposure unit. The optical modulation elements are successively and selectively operated based on pattern bit-data to thereby modulate a light beam made incident on each optical modulation element, whenever the exposure unit is moved in the drawing direction by a distance of "A+a". According to the present invention, the distance of "A" is defined as a distance corresponding to an integer-multiple of a dimension of a unit exposure zone produced on the drawing surface by each optical modulation element, and the distance of "a" is defined as a smaller distance than the dimension of the unit exposure zone.

The angle may be defined such that the exposure unit is shifted by a distance "b" in the second array-direction when the relative movement of the exposure unit is performed by the distance of "A+a". The dimension of the unit exposure zone may be completely divisible by the distance "b". Optionally, the dimension of the unit exposure zone may be indivisible by the distance "b".

The relative movement of the exposure unit may be stopped whenever the exposure unit is moved by the distance of "A+a". In this case, the modulation of the light beam by the optical modulation elements is performed during the stoppage of the exposure unit. Optionally, the exposure unit may be continuously moved at a constant velocity. In this case, the modulation of the light beam by the optical modulation elements is performed whenever the exposure unit is moved by the distance of "A+a", a time of the modulation being shorter than a time during which the exposure unit is moved by the dimension of the unit exposure zone.

In accordance with another aspect of the present invention, there is provided a multi-exposure drawing apparatus that draws a pattern on a drawing surface, using an exposure unit including a plurality of optical modulation elements arranged in both a first array-direction and a second array-direction. The multi-exposure drawing apparatus comprises a movement system that moves the exposure unit in relation to the drawing surface in a drawing direction. The drawing direction is inclined so as to form an angle with respect to the first array-direction, whereby the exposure unit is gradually shifted in the second array-direction during the movement of the exposure unit. The apparatus also comprises a modulation system that operates successively and selectively the optical modulation elements based on pattern bit-data to thereby modulate a light beam made incident on each optical modulation element, whenever the exposure unit is moved in the drawing direction by a distance of "A+a". Similar to the multi-exposure drawing method, the distance of "A" is defined as a distance corresponding to an integer-multiple of a dimension of a unit exposure zone produced on the drawing surface by each optical modulation element, and the distance of "a" is defined as a smaller distance than the dimension of the unit exposure.

The movement system may include an intermittent system that stops the relative movement of the exposure unit whenever the exposure unit is moved by the distance of "A+a". In this case, the modulation of the light beam by the optical modulation elements is performed during the stoppage of the exposure unit.

Optionally, the movement system may include a control system that continuously moves the exposure unit at a constant velocity during a drawing operation. In this case, the modulation system includes a control system that controls the modulation of the light beam by the optical modulation elements such that the modulation is performed whenever the exposure unit is moved by the distance of "A+a", a time of the modulation being shorter than a time during which the exposure unit is moved by the dimension of the unit exposure zone.

Also, the modulation system may include an optical focussing system that produces the unit exposure zone on the drawing surface with the modulated light beam so as to be a same size as that of the corresponding optical modulation element.

The multi-exposure drawing apparatus further comprise an exposure system including a plurality of exposure units which are transversely aligned with each other with respect to the drawing direction, a light source system that emits a light beam for an exposure operation, and a light-beam distribution system provided between the plurality of exposure units and the light source system such that the light beam, emitted from the light source system, is uniformly distributed to the exposure units.

Preferably, the light-beam distribution system includes a plurality of mirror elements, which are arranged such that the uniform distribution of the light beam to the exposure units is carried out. Each of the mirror elements may be formed as a beam splitter. In this case, the light beam is successively split into light beams by the beam splitters such that the split light beams are distributed to the exposure units, and individual transmission efficiencies of the beam splitters are regulated such that the uniform distribution of the light beam to the exposure units is carried out.

Each of the beam splitters may be provided at an exterior of a corresponding exposure unit. Optionally, Each of the beam splitters is assembled in an interior of a corresponding exposure unit.

BRIEF DESCRIPTION OF THE DRAWINGS

The aforesaid objects and other objects of the invention will be better understood from the following descriptions, with reference to the accompanying drawings, in which:

FIG. 2 is a conceptual view for explaining a function of a digital micro-mirror device (DMD) unit used in the multi-exposure drawing apparatus shown in FIG. 1;

FIG. 3 is a conceptual view showing an arrangement of fifteen full exposure zones projected by fifteen DMD units, used in the multi-exposure drawing apparatus, on a geometric surface including a drawing surface, together with an X-Y coordinate system defined on the geometric surface;

FIGS. 4(A), 4(B), and 4(C) are concetual views explaining a principle of a multi-exposure method according to the present invention;

DESCRIPTION OF THE PREFERRED EMBODIMENTS

Figure 1:
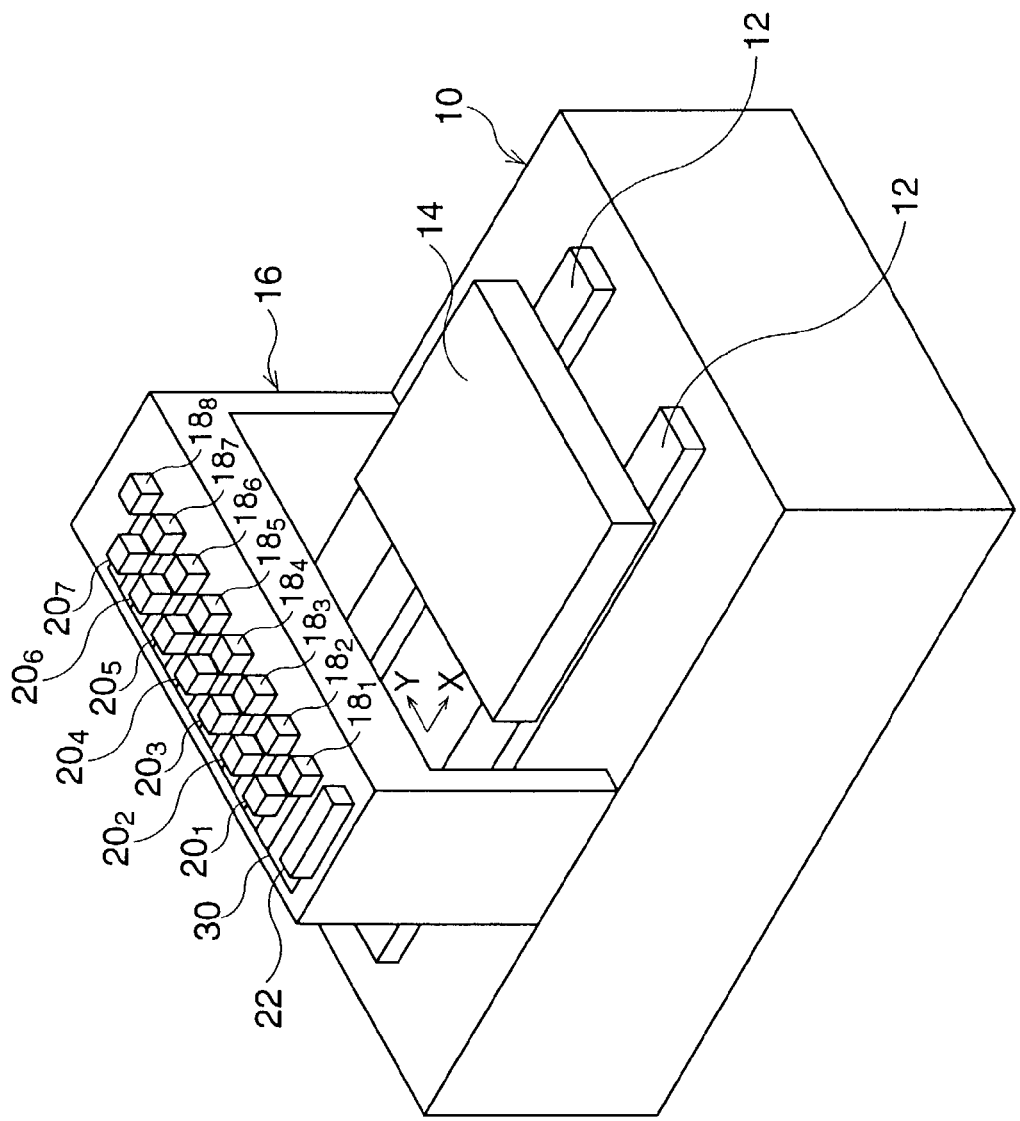
FIG. 1 is a perspective view schematically showing a multi-exposure drawing apparatus according to the present invention.

FIG. 1 schematically and perspectively shows an embodiment of the multi-exposure drawing apparatus according to the present invention, which is constituted to directly draw a circuit pattern on a photoresist layer formed on a suitable substrate, for manufacturing a printed circuit board.

As shown in FIG. 1, the multi-exposure drawing apparatus comprises a base structure 10 installed on a floor, a pair of guide rails 12 laid on the base structure 10, and a drawing table movably placed on the pair of guide rails 12. Although not illustrated in FIG. 1, the drawing table 14 is moved along the pair of guide rails 12 by a drive motor, such as a stepping motor, a servo motor or the like through a suitable drive mechanism, such as a ball-screw mechanism, and a workpiece carrying a photoresist layer is mounted and fixed on the drawing table 14 using suitable clamps.

The apparatus further comprises a bridge-like structure 16, erected so as to straddle the pair of guide rails 12 on the base structure 10, and respective first and second arrays of exposure units $18_1$ to $18_8$ and $20_1$ to $20_7$ provided on the top of the bridge-like structure 16. These exposure units $18_1$ to $18_8$ and $20_1$ to $20_7$ are identical to each other.

As shown in FIG. 1, a two-dimensional X-Y coordinate system is defined on a geometric surface which is in parallel to the top surface of the base structure 10. The first array includes eight exposure units $18_1$ to $18_8$ aligned with each other along the X-axis of the X-Y coordinate system. Similarly, the second array includes seven exposure units $20_1$ to $20_7$ aligned with each other along the X-axis of the X-Y coordinate system. The alignment of both the exposure units $18_1$ to $18_8$ and the exposure units $20_1$ to $20_7$ is carried out at an array pitch corresponding to a distance which is twice as long as the lateral width of each exposure unit, but the exposure units $18_1$ to $18_8$ and the exposure units $20_1$ to $20_7$ are aligned so as to be staggered by an amount equal to a half of times the array pitch with respect to each other, as is apparent from FIG. 1.

In this embodiment, each of the exposure units $18_1$ to $18_8$ and $20_1$ to $20_7$ comprises a digital micro-mirror device (DMD) unit having a reflecting surface which is formed from a plurality of micro-mirror elements arranged in a 1024×1280 matrix manner. Each of the DMD units $18_1$ to $18_8$ and $20_1$ to $20_7$ is oriented so that a line-alignment of 1280 micro-mirror elements runs along the Y-axis of the X-Y coordinate system, i.e. that a column-alignment of 1024 micro-mirror elements runs along the X-axis of the X-Y coordinate system.

The multi-exposure drawing apparatus is provided with a light source device 22 mounted on the top of the bridge-like structure 16, and the light source device 22 contains a plurality of light emitting diodes (LED). The light source device 22 has an optical condenser lens system for collecting light emitted by the LED's, and an optical collimating lens system for outputting the collected light as a parallel light beam. Although not shown in FIG. 1, each of the DMD units $18_1$ to $18_8$ and $20_1$ to $20_7$ is optically connected to the light source device 22 through the intermediary of fifteen optical fiber cables. In particular, the light source device 22 has a light-beam-emitting port to which ends of the fifteen optical fiber cables are optically connected, and the other end of each optical fiber cable is connected to a light-beam-receiving port of a corresponding DMD unit ($18_1, \ldots, 18_8; 20_1, \ldots, 20_7$).

Referring to FIG. 2, a function of each DMD unit ($18_1, \ldots, 18_8; 20_1, \ldots, 20_7$) is conceptually illustrated. In this drawing, reference 24 indicates a reflecting surface of each DMD unit, and the reflecting surface 24 is formed from the 1024×1280 micro-mirror elements, as already stated. Each DMD unit ($18_1, \ldots, 18_8; 20_1, \ldots, 20_7$) is provided with an illuminating lens system, generally indicated by reference 26, and a focussing lens system, generally indicated by reference 28. Note, in FIG. 2, reference 30 indicates an optical fiber cable extending from the light source device 22.

The illuminating lens system 26 includes a convex lens 26A and a collimating lens 26B optically associated with each other, as shown in FIG. 2, and the convex lens 26A is optically connected with the optical fiber cable 30. The light beam, emitted from the optical fiber cable 30, is first spread by the convex lens 26A, and the spread light is then shaped as a parallel light beam LB by the collimating lens 26B, so that the reflecting surface 24 of each DMD unit ($18_1, \ldots, 18_8; 20_1, \ldots, 20_7$) is uniformly illuminated with the parallel light beam LB. The focussing lens system 28 includes a first convex lens 28A, a reflector 28B, and a second convex lens 28C optically associated with each other, and features a magnifying power of "1".

In the DMD units $18_1$ to $18_8$, and $20_1$ to $20_7$, each of the micro-mirror elements is movable between a first reflecting position and a second reflecting position. While the light beam LB is received by the reflecting surface 24 of the DMD unit, the micro-mirror element reflects the received light at the first reflecting position such that it is introduced into the focussing lens system 28, and the micro-mirror element reflects the received light at the second reflecting position such that it deviates from the focussing lens system 28. In FIG. 2, the light, introduced into the focussing lens system 28, is shown as a first reflected light beam $LB_1$, and the light, deviating from the focussing lens system 28, is shown as a second reflected light beam $LB_2$. In short, each of the micro-mirror elements serves as an optical modulation element.

Note; the components of the light beam $LB_1$, reflected by all the micro-mirror elements of the fifteen DMD units $18_1$ to $18_8$ and $20_1$ to $20_7$, have substantially the same intensity of light.

In FIG. 2, reference 32 indicates a drawing surface of the photoresist layer of the workpiece placed on the drawing table 14, and the drawing surface 32 is included in the aforesaid geometric surface on which the two-dimensional X-Y coordinate system is defined. The reflecting face of each micro-mirror element is focused as a unit exposure zone on the drawing surface 32 by the focussing lens system 28 when the micro-mirror element is placed at the first reflecting position. For example, when each of the micro-mirror elements, included in the DMD units $18_1$ to $18_8$ and $20_1$ to $20_7$, has a size of 20×20 μm, the unit exposure zone has a size of 20×20 μm on the drawing surface 23, due to the magnifying power of "1" of the focussing lens system 28.

In the DMD units $18_1$ to $18_8$ and $20_1$ to $20_7$, each micro-mirror element is usually positioned at the second reflecting position or non-exposure-reflecting position. By driving the micro-mirror element from the second reflecting position or non-exposure-reflecting position to the first reflecting position or exposure-reflecting position, an exposure operation is performed, thereby selectively producing a unit exposure zone on the drawing surface 32. After the exposure operation is finished, the micro-mirror element concerned is returned from the exposure-reflecting position to the non-exposure-reflecting position. The movement of the micro-mirror element from the non-exposure-reflecting position to the exposure-reflecting position is performed in accordance with the circuit pattern data (raster-graphic data), as stated in detail hereinafter.

Note, obviously, the light beam $LB_2$, deviating from the focussing lens system 28, is suitably dealt with so that it cannot reach the drawing surface 32.

When all the micro-mirror elements included in each DMD unit ($18_1, \ldots, 18_8; 20_1, \ldots, 20_7$) are driven from the non-exposure-reflecting position to the exposure-reflecting position, a full exposure zone is formed on the drawing surface 32 by the focussing lens system 28. Of course, the full exposure zone is formed by the number of 1024×1280 unit exposure zones, and the size of the full exposure zone is (1024×20)×(1280×20) μm.

Referring to FIG. 3, fifteen full exposure zones $Z18_1$ to $Z18_8$ and $Z20_1$ to $Z20_7$ are conceptually shown as being projected on the geometric surface including the drawing surface 32. Of course, the respective eight full exposure zones $Z18_1$ to $Z18_8$ are derived from the DMD units $18_1$ to $18_8$ included in the first array, and the respective seven full exposure zones $Z20_1$ to $Z20_7$ are derived from the DMD units $20_1$ to $20_7$ included in the second array. Also, in FIG. 3, to clarify the positional relationship between the drawing table 14 and the fifteen full exposure zones $Z18_1$ to $Z18_8$ and $Z20_1$ to $Z20_7$, the table 14 is shown by a phantom line.

In FIG. 3, although the Y-axis of the X-Y coordinate system is shown as being extended so as to be contiguous to the leading edges of the eight full exposure zones $Z18_1$ to $Z18_8$, and although the origin of the X-Y coordinate system is shown as being at an outer corner of the leading edge of the full exposure zone $Z18_1$, in reality, the origin of the coordinate system is placed at the center of the unit exposure zone at the outer corner of the full exposure zone $Z18_1$. Namely, the Y-axis of the X-Y coordinate system enters the eight full exposure zones $Z18_1$ to $Z18_8$ after a distance of 10 μm measured from the leading edges of the eight full exposure zones $Z18_1$ to $Z18_8$, due to the size (20×20 μm) of a unit exposure zone.

In FIG. 3, the movement direction of the drawing table 14 is indicated by an arrow AR, and the drawing table 14 is inclined with respect to the X-axis of the X-Y coordinate system so as to define an angle of "α". Accordingly, as the drawing table 14, and therefor, the drawing surface 32, is moved along the movement direction AR, the full exposure zones $Z18_1$ to $Z18_1$ and $Z20_1$ to $Z20_7$ are gradually shifted in the minus direction of the Y-axis of the X-Y coordinate system. In the example of FIG. 3, although the movement direction AR of the drawing table 14 is inclined with respect to the X-axis of the X-Y coordinate system, the alignment of both the exposure units $18_1$ to $18_8$ and the exposure units $20_1$ to $20_7$ may be inclined with respect to the Y-axis of the X-Y coordinate system so as to define an angle of "α". Of course, in the latter case, the drawing table 14 is moved along the minus direction of the X-axis of the X-Y coordinate system. Note, in FIG. 3, although the angle of a is exaggerated, in reality, it is a very fine angle, as stated hereinafter.

In a drawing operation using the apparatus, the drawing table 14 is moved in the movement direction AR. During the movement of the drawing table 14, each line-alignment of the 1280 micro-mirror elements, included in each DMD unit ($18_1, \ldots, 18_8; 20_1, 20_7$), is selectively operated based on a line of 1280 raster-graphic bit-data, and thus the drawing surface 32 is scanned with light beams $LB_1$ reflected by the micro-mirror elements driven from the non-exposure-reflecting position to the exposure-reflecting position.

In particular, when a drawing-start position on the drawing surface 32 reaches the Y-axis of the coordinate system, first, the selective operation of the micro-mirror elements, included in the first array of the DMD units $18_1$ to $18_8$, is started, and then the selective operation of the micro-mirror elements, included in the second array of DMD units $20_1$ to $20_7$, is started after the drawing table 14 is moved by a distance "S" between the leading edges of the eight full exposure zones $Z18_1$ to $Z18_8$ and the leading edges of the seven full exposure zones $Z20_1$ to $Z20_8$ (FIG. 3). Thus, the fifteen full exposure zones $Z18_1$ to $Z18_8$ and $Z20_1$ to $Z20_7$ can be aligned with each other on the drawing surface 32 along the Y-axis of the coordinate system. Namely, when a circuit pattern is drawn using the fifteen DMD units $18_1$ to $18_8$, and $20_1$ to $20_7$ on the drawing surface 32, each lateral drawing line of the drawn circuit pattern, extending along the Y-axis of the coordinate system, is formed by the number of 1280×15 pixels.

A principle of the present invention for drawing a circuit pattern is explained below.

First, the drawing table 14 is continuously moved from an initial position or home position toward the DMD units $18_1$ to $18_8$ and $20_1$ to $20_7$, and is stopped when the drawing-start position on the drawing surface 32 reaches the Y-axis of the X-Y coordinate system. Then, the drawing table 14 is intermittently moved from the drawing-start position such that the intermittent movement is performed at regular intervals of a distance "A+a". Herein: the distance "A" is defined as an integer-multiple of the dimension "20 µm" of the unit exposure size (20×20 µm); and the distance "a" is defined as a distance less than the dimension "20 µm". Namely, whenever the drawing table 14 is moved by the distance "A+a", the drawing table 14 is stopped, and each stop-position is defined as an exposure-operation position.

As stated above, in reality, although the drawing table 14 is moved along the movement direction AR in relation to the DMD units $18_1$ to $18_8$ and $20_1$ to $20_7$, it is supposed that the DMD units $18_1$ to $18_8$ and $20_1$ to $20_7$ are moved along the counter direction to the movement direction AR in relation to the drawing table 14, for convenience of the explanations for the principle of the present invention.

FIG. 4(A) shows a part of a full exposure zone, which is to be projected on the X-Y surface of the X-Y coordinate system when supposing that all the micro-mirror elements of the DMD unit $18_1$ are driven to the exposure-reflecting position at the first exposure-operation position or drawing-start position (DSP). The full exposure zone is formed from the 1024×1280 unit exposure zones, each of which is represented by $U_{(n,m)}$ ($1 \leq n \leq 1024$ and $1 \leq m \leq 1280$).

In FIG. 4(A), the unit exposure zones $U_{(1,1)}$, $U_{(1,2)}$, $U_{(1,3)}$, ..., and $U_{(1,m)}$ are derived from the first line-alignment of 1280 micro-mirror elements of the DMD unit $18_1$; the unit exposure zones $U_{(2,1)}$, $U_{(2,2)}$, $U_{(2,3)}$, ..., and $U_{(2,m)}$ are derived from the second line-alignment of 1280 micro-mirror elements of the DMD unit $18_1$; and the unit exposure zones $U_{(3,1)}$, $U_{(3,2)}$, $U_{(3,3)}$, ..., and $U_{(3,m)}$ are derived from the third line-alignment of 1280 micro-mirror elements of the DMD unit $18_1$. On the other hand, the unit exposure zones $U_{(1,1)}$, $U_{(2,1)}$, $U_{(3,1)}$, ..., and $U_{(n,1)}$ are derived from the first column-alignment of 1024 micro-mirror elements of the DMD unit $18_1$; the unit exposure zones $U_{(1,2)}$, $U_{(2,2)}$, $U_{(3,2)}$, ..., and $U_{(n,2)}$ are derived from the second column-alignment of 1024 micro-mirror elements of the DMD unit $18_1$; and the unit exposure zones $U_{(1,3)}$, $U_{(2,3)}$, $U_{(3,3)}$, ..., and $U_{(n,3)}$ are derived from the third column-alignment of 1024 micro-mirror elements of the DMD unit $18_1$.

Note, in FIG. 4(a), although the X-Y coordinate system should be shown such that the origin is located at the central of the unit exposure zone $U_{(1,1)}$ because the drawing-start position (DSP) on the drawing surface 32 coincides with the Y-axis of the X-Y coordinate system when the DMD unit $18_1$ is at the drawing-start position (DSP), the X-Y coordinate system is shown above the arrangement of the unit exposure zones for convenient.

In reality, at the first exposure-operation position or drawing-start position (DSP), only the first line-alignment of 1280 micro-mirror elements reaches the drawing-start position (DSP), and is selectively operated based on 1280 raster-graphic bit-data. If all the 1280 raster-graphic bit-data have a value of "1", a line-alignment of unit exposure zones $U_{(1,1)}$, $U_{(1,2)}$, $U_{(1,3)}$, ..., and $U_{(1,m)}$ is produced on the X-Y surface or drawing surface 32.

After the exposure operation is completed at the first exposure-operation position, the DMD unit $18_1$ is moved toward a second exposure-operation position, which is apart from the first exposure-operation position by the distance "A+a", as shown in FIG. 4(B). In this example, the distance "A" is "80 µm", which is a multiple of four of the dimension "20 µm" of the unit exposure size (20×20 µm), and the distance "a" is smaller than the dimension "20 µm", as already stated.

At the second exposure-operation position, the respective first to fifth line-alignments of the 1280 micro-mirror elements are selectively operated based on 1280×5 raster-graphic bit-data, because the first to fourth line-alignments of 1280 micro-mirror elements pass beyond the drawing-start position (DSP), and because the fifth line-alignment of the 1280 micro-mirror elements has already reached the drawing-start position (DSP). If all the 1280×5 raster-graphic bit-data have a value of "1", first to fifth line-alignments of the unit exposure zones $U_{(1,1)}$, $U_{(1,2)}$, $U_{(1,3)}$, ..., and $U_{(1,m)}$; ...; and $U_{(5,1)}$, $U_{(5,2)}$, $U_{(5,3)}$, ..., and $U_{(5,m)}$ are produced on the X-Y surface or drawing surface 32.

In this case, the first line-alignment of the unit exposure zones $U_{(1,1)}$, $U_{(1,2)}$, $U_{(1,3)}$, ..., and $U_{(1,m)}$, which is produced at the first exposure-operation position (FIG. 4(A)), and the fifth line-alignment of the unit exposure zones $U_{(5,1)}$, $U_{(5,2)}$, $U_{(5,3)}$, ..., and $U_{(5,m)}$, which is produced at the second exposure-operation position (FIG. 4(B)), overlap with each other, such that both the first and fifth line-alignments are shifted with respect to each other by the distance "a" along the X-axis of the X-Y coordinate system.

After the exposure operation is completed at the second exposure-operation position, the DMD unit $18_1$ is further moved to a third exposure-operation position, which is apart from the second exposure-operation position by the distance "A+a", as shown in FIG. 4(C). In the third exposure-operation position, the respective first to ninth line-alignments of the 1280 micro-mirror elements are selectively operated based on 1280×9 raster-graphic bit-data, because the first to eighth line-alignments of the 1280 micro-mirror elements pass beyond the drawing-start position (DSP), and because the ninth line-alignment of 1280 micro-mirror elements has already reached the drawing-start position (DSP). If all the 1280×9 raster-graphic bit-data have a value of "1", first to ninth line-alignments of unit exposure zones $U_{(1,1)}$, $U_{(1,2)}$, $U_{(1,3)}$, ..., and $U_{(1,m)}$; ...; and $U_{(9,1)}$, $U_{(9,2)}$, $U_{(9,3)}$, ..., and $U_{(9,m)}$ are produced on the X-Y surface or drawing surface 32.

In this case, the first line-alignment of the unit exposure zones $U_{(1,1)}$, $U_{(1,2)}$, $U_{(1,3)}$, ..., and $U_{(1,m)}$, which is produced at the first exposure-operation position (FIG. 4(A)), and the ninth line-alignment of the unit exposure zones $U_{(9,1)}$, $U_{(9,2)}$, $U_{(9,3)}$, ..., and $U_{(9,m)}$, which is produced at the third exposure-operation position (FIG. 4(C)), overlap with each other, such that both the first and ninth line-alignments are shifted with respect to each other by the distance "$2a$" along the X-axis of the X-Y coordinate system.

Also, the fifth line-alignment of the unit exposure zones $U_{(5,1)}$, $U_{(5,2)}$, $U_{(5,3)}$, ..., and $U_{(5,m)}$, which is produced at the second exposure-operation position (FIG. 4(A)), and the ninth line-alignment of the unit exposure zones $U_{(9,1)}$, $U_{(9,2)}$, $U_{(9,3)}$, ..., and $U_{(9,m)}$, which is produced at the third exposure-operation position (FIG. 4(C)), are laid to overlap each other, such that both the fifth and ninth line-alignments are shifted with respect to each other by the distance "$a$" along the X-axis of the X-Y coordinate system.

Further, the respective first to fourth line-alignments of the unit exposure zones $U_{(1,1)}$, $U_{(1,2)}$, $U_{(1,3)}$, ..., and $U_{(1,m)}$; ...; and $U_{(4,1)}$, $U_{(4,2)}$, $U_{(4,3)}$, ..., and $U_{(4,m)}$, which are produced at the second exposure-operation position, overlap with the fifth to eighth line-alignments of the unit exposure zones $U_{(5,1)}$, $U_{(5,2)}$, $U_{(5,3)}$, ..., and $U_{(5,m)}$; ...; and $U_{(8,1)}$, $U_{(8,2)}$, $U_{(8,3)}$, ..., and $U_{(8,m)}$, which are produced at the third exposure-operation position such that both two corresponding line-alignments are shifted with respect to each other by the distance "$a$" along the X-axis of the X-Y coordinate system.

Figure 5:
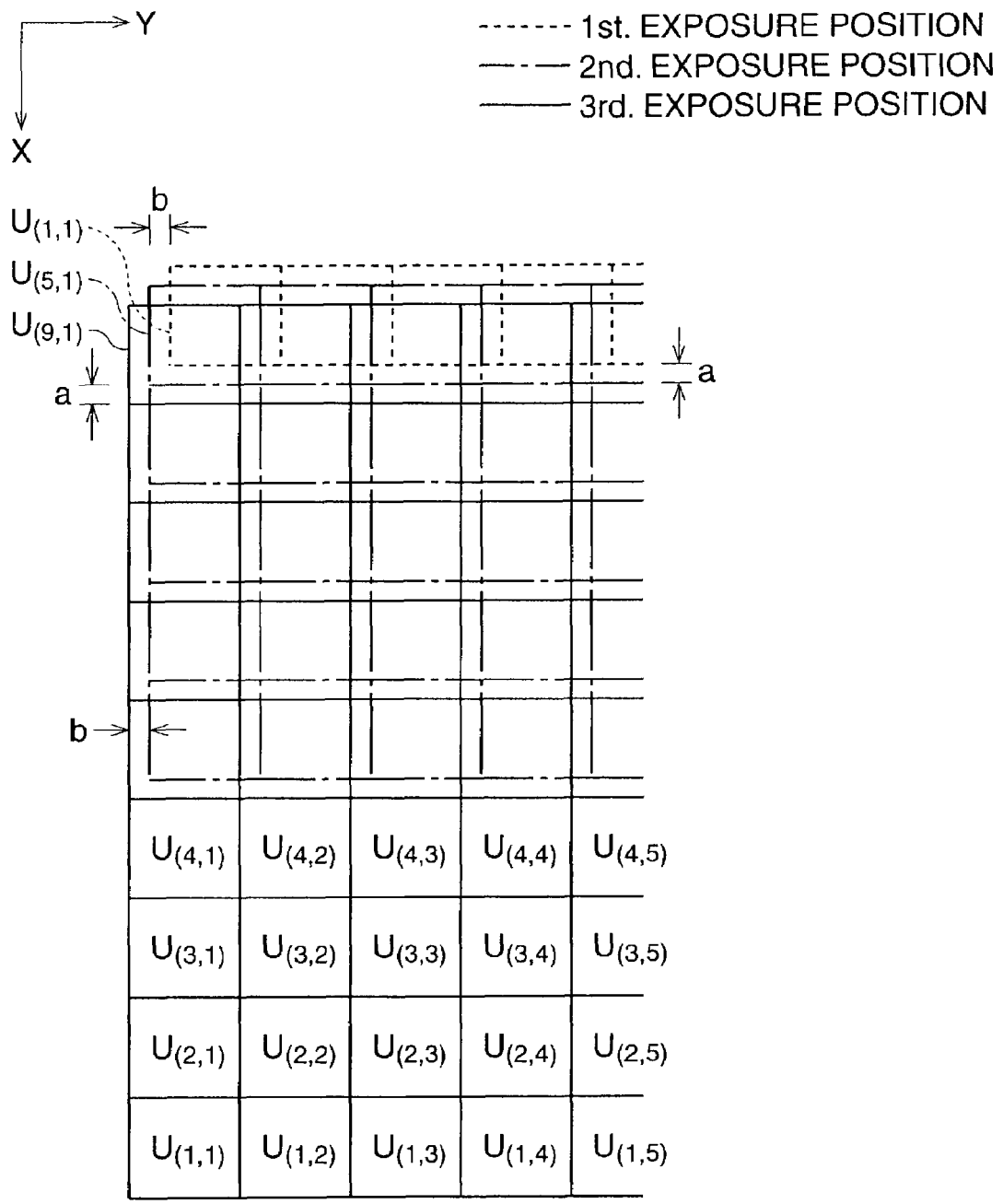
FIG. 5 is another conceptual view explaining a principle of a multi-exposure method according to the present invention.

On the other hand, since the movement direction AR of the drawing table 14 (and therefore, the DMD unit $18_1$) is inclined with respect to the X-axis of the X-Y coordinate system to define the angle of "$\alpha$", when the DMD unit $18_1$ is moved from the first exposure-operation position (FIG. 4(A)) to the second exposure-operation position (FIG. 4(B)), the DMD unit $18_1$ is shifted in the minus direction of the Y-axis of the X-Y coordinate system by a distance "$b$", which is determined by a magnitude of the angle of "$\alpha$", as shown in FIG. 5. In this drawing, the unit exposure zones $U_{(n,m)}$, produced at the first exposure-operation position, are shown by broken lines; the unit exposure zones $U_{(n,m)}$, produced at the second exposure-operation position, are shown by one-dot chain lines; and the unit exposure zones $U_{(n,m)}$, produced at the third exposure-operation position, are shown by solid lines.

As is apparent from FIG. 5, for example, the unit exposure zone $U_{(5,1)}$, produced at the second exposure-operation position (FIG. 4(B)), is shifted from the unit exposure zone $U_{(1,1)}$, produced at the first exposure-operation position (FIG. 4(A)), by the distance "$+a$" along the X-axis of the X-Y coordinate system, and by the distance "$-b$" along the Y-axis of the X-Y coordinate system. The same is true for the relationship between the unit exposure zone $U_{(1,m)}$, produced at the first exposure-operation position, and the unit exposure zone $U_{(5,m)}$, produced at the second exposure-operation position.

Similarly, the unit exposure zone $U_{(9,1)}$, produced at the third exposure-operation position (FIG. 4(C)), is shifted from the unit exposure zone $U_{(1,m)}$, produced at the first exposure-operation position (FIG. 4(A)), by the distance "$+2a$" along the X-axis of the X-Y coordinate system, and by the distance "$-2b$" along the Y-axis of the X-Y coordinate system. The same is true for the relationship between the unit exposure zone $U_{(1,m)}$, produced at the first exposure-operation position, and the unit exposure zone $U_{(9,m)}$, produced at the third exposure-operation position.

Figure 6:
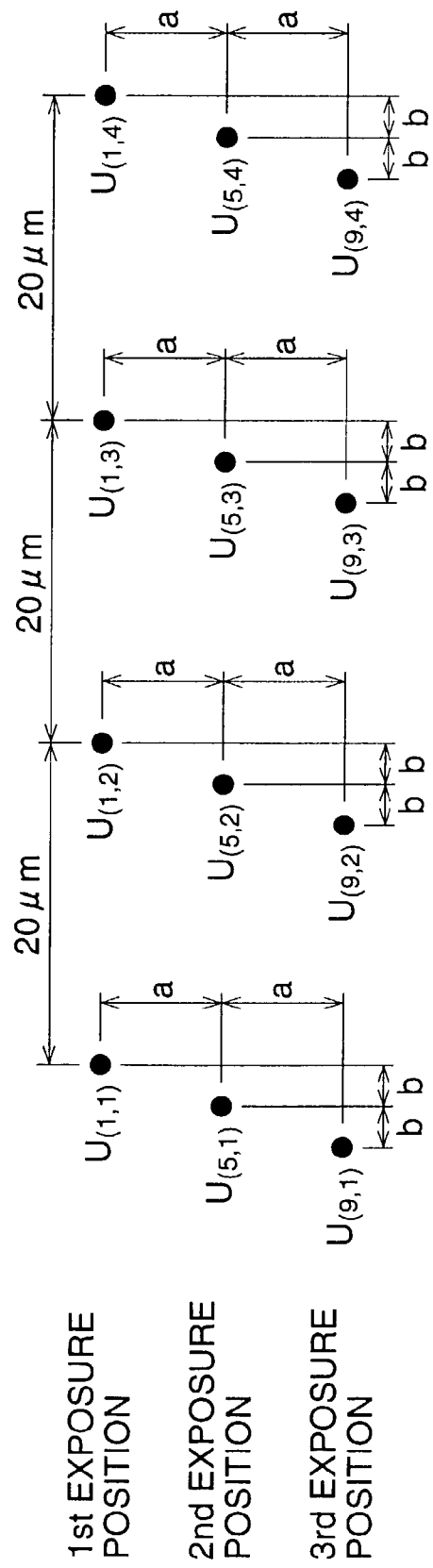
FIG. 6 is a distribution view of center loci of unit exposure zones, which are produced by micro-mirror elements of a DMD unit when the DMD unit is moved in relation to a drawing surface according to the principle of the present invention.

Referring to FIG. 6, the center loci of the unit exposure zones $U_{(1,1)}$, $U_{(1,2)}$, $U_{(1,3)}$, and $U_{(1,4)}$, produced at the first exposure-operation position (FIG. 4(A)), are indicated by small solid circles. Similarly, the center loci of the unit exposure zones $U_{(5,1)}$, $U_{(5,2)}$, $U_{(5,3)}$, and $U_{(5,4)}$, produced at the second exposure-operation position (FIG. 4(B)), are indicated by small solid circles, and the center loci of the unit exposure zones $U_{(9,1)}$, $U_{(9,2)}$, $U_{(9,3)}$, and $U_{(9,4)}$, produced at the third exposure-operation position (FIG. 4(C)), are also indicated by small solid circles. As is apparent from this drawing, by repeating the exposure operations under the aforesaid conditions, it is possible to uniformly distribute the center loci of the unit exposure zones on the X-Y surface of the X-Y coordinate system.

By suitably selecting and determining the values of the distances "$a$" and "$b$", it is possible to uniformly distribute plural center loci of the unit exposure zones in an area of 20×20 μm, which is equal to the unit exposure size (20×20 μm). For example, in order to uniformly distribute 256 center loci of the unit exposure zones in the area of 20×20 μm, as shown in FIG. 7, the values of the distances "$a$" and "$b$" are determined as follows:

$$a = 20 \ \mu m/16$$
$$= 1.25 \ \mu m$$
$$b = 20 \ \mu m/256$$
$$= 0.078125 \ \mu m$$

Note, of course, the determination of 0.078125 μm as the distance "$b$" means that the angle of "$\alpha$" is set so that the DMD unit $18_1$ is shifted by the distance of 0.078125 μm in the minus direction of the Y-axis of the X-Y coordinate system when the DMD unit $18_1$ is moved by the distance of "A+a=81.25 μm" along the counter direction to the movement direction AR.

Figure 7:
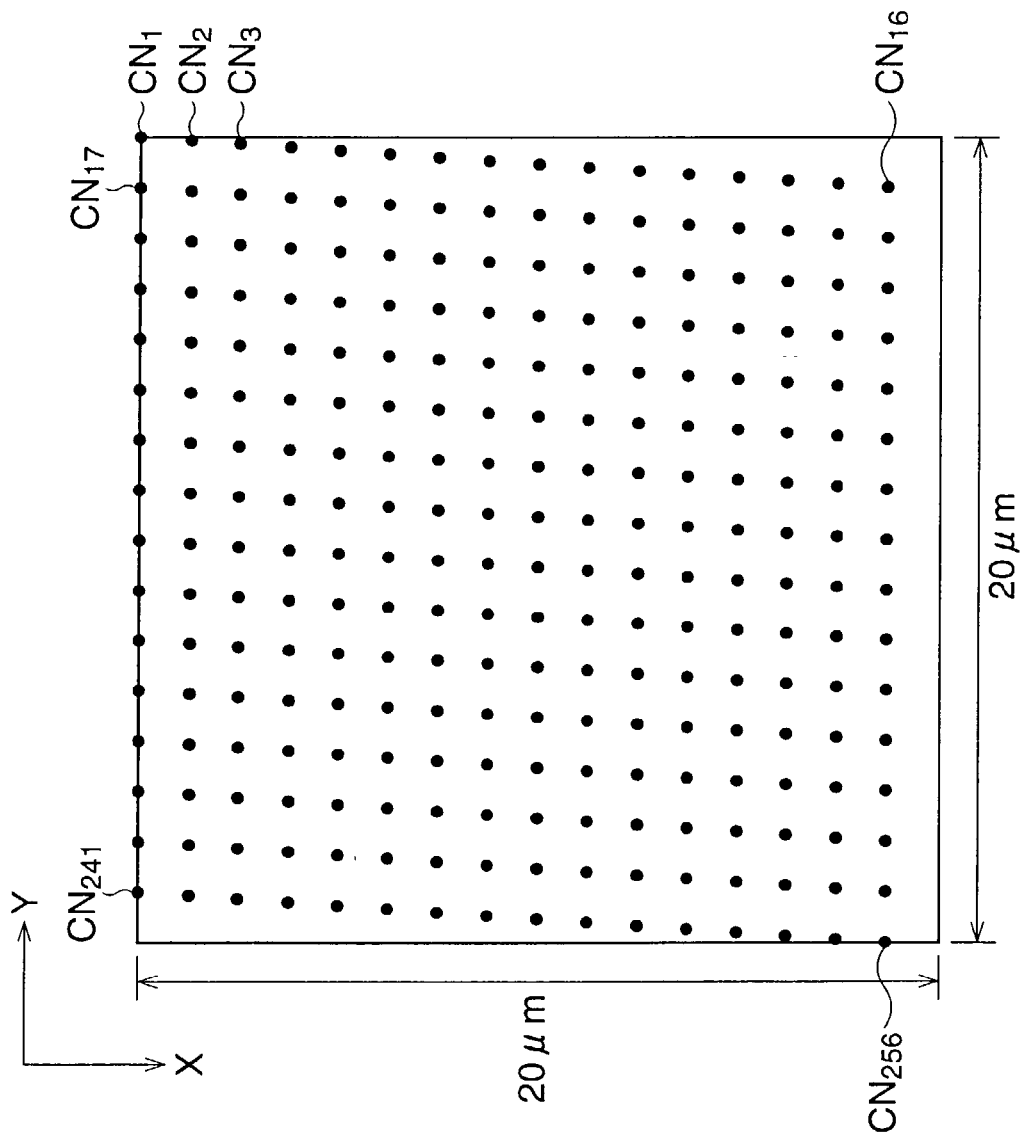
FIG. 7 is a distribution view, similar to FIG. 6, of how the center loci of the unit exposure zone are arranged in a zone equivalent to the unit exposure zone.

In FIG. 7, if a center locus $CN_1$ is derived from the unit exposure zone $U_{(1,1)}$ produced at the first exposure-operation position (FIG. 4(A)), respective center loci $CN_2$ and $CN_3$ are derived from the unit exposure zones $U_{(5,1)}$ and $U_{(9,1)}$ produced at the second and third exposure-operation positions (FIGS. 4(B) and 4(C)). In general, when a center locus $CN_k$ is derived from a unit exposure zone $U_{(n,1)}$ which is produced at a $k^{th}$ exposure-operation position by the spearhead micro-mirror included in the $n^{th}$ line-alignment, the relationship between the "n" and the "k" is represented by the following equation:

$$n = 4(k-1) + 1 \ (1 \leq k \leq 256)$$

For example, a center locus $CN_{16}$ is derived from a unit exposure zone $U_{(61,1)}$, which is produced at a sixteenth exposure-operation position by the spearhead micro-mirror included in the $61^{st}$ line-alignment, and a center locus $CN_{17}$ is derived from a unit exposure zone $U_{(65,1)}$, which is produced at the seventeenth exposure-operation position by the spearhead micro-mirror included in the $65^{th}$ line-alignment. Similarly, for example, a center locus $CN_{241}$ is derived from a unit exposure zone $U_{(961,1)}$, which is produced at the $241^{st}$ exposure-operation position by the spearhead micro-mirror included in the $961^{st}$ line-alignment, and a center locus $CN_{256}$ is derived from a unit exposure zone $U_{(1021,1)}$, which is produced at the 256$^{th}$ exposure-operation position by the spearhead micro-mirror included in the 1021$^{st}$ line-alignment.

Figure 8:
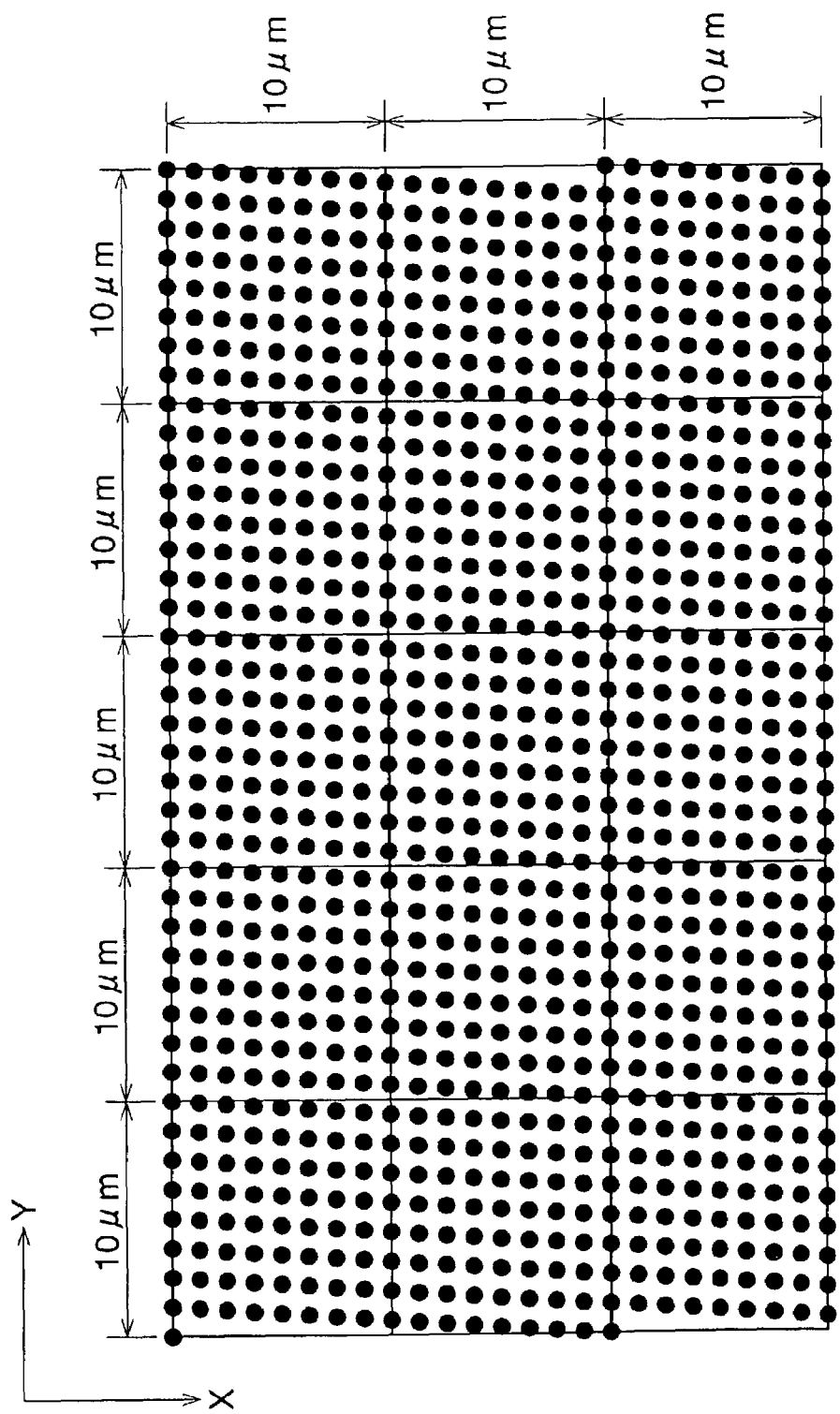
FIG. 8 is a broader extent view showing the distribution view of FIG. 7.

Thus, by repeating the exposure operations by the DMD units $18_1$ to $18_8$ and $20_1$ to $20_7$ under the aforesaid conditions (A=80 µm, a=1.25 µm, b=0.078125 µm), it is possible to uniformly distribute a plurality of center loci on the X-Y surface of the X-Y coordinate system with a high density, as partially shown in FIG. 8. Of course, in the example, as stated above, the 256 center loci are included in the area of 20×20 µm, which is equal to the unit exposure size (20×20 µm).

Also, according to the present invention, a plurality of center loci can be uniformly distributed on the X-Y surface with a higher density than that shown in the example of FIG. 8. For example, under the conditions of A=40 µm, a=1.25/2 µm, b=0.078125/2 µm, the 512 center loci are included in the area of 20×20 µm.

In the representative example of FIG. 8, the center loci are aligned with each other parallel with the Y-axis of the X-Y coordinate system, due to the fact that the dimension 20 µm is completely divided by the distance "a=1.25 µm" without any remainder. In particular, for example, when the DMD unit $18_1$ reaches the seventeenth exposure-operation position, the sum of the distances "a" becomes equivalent to the dimension "20 µm (16×1.25 µm)", and thus the center locus $CN_{17}$ is aligned with the center locus $CN_1$ parallel with the Y-axis of the X-Y coordinate system, as shown in FIG. 7. Similarly, when the DMD unit $18_1$ reaches the 241$^{st}$ exposure-operation position, the sum of the distances "a" becomes "300 µm", which is equivalent to a multiple of fifteen of the dimension "20 m, and thus the center locus $CN_{241}$ is aligned with the center loci $CN_1$ and $CN_{17}$ parallel with the Y-axis of the X-Y coordinate system, as shown in FIG. 7.

Figure 9:
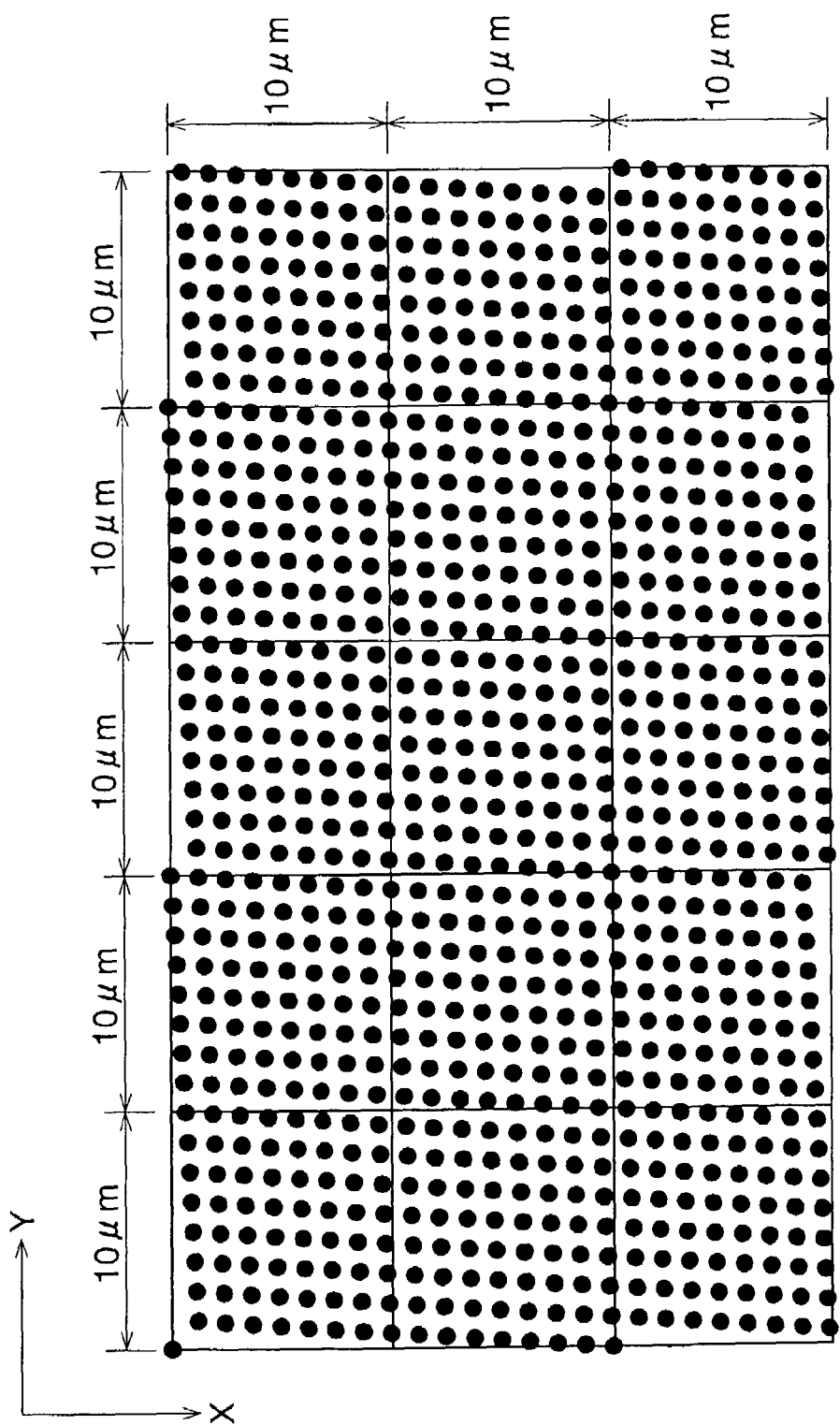
FIG. 9 is a broader extent view, similar to FIG. 8, which is obtained when the DMD unit is moved under somewhat different conditions.

According to the present invention, it is also possible to incline a line-alignment of center loci with respect to the Y-axis of the X-Y coordinate system. For example, when the respective small values of "0.0049" and "0.000306" are added to the distances "a=1.25 µm" and "b=0.078125 µm", the plurality of center loci is uniformly distributed in a manner in which the line-alignments of center loci are inclined with respect to the Y-axis of the X-Y coordinate system, as shown in FIG. 9. In particular, for example, when the DMD unit $18_1$ reaches the seventeenth exposure-operation position, the center locus $CN_{17}$ is offset by the distance of "0.0049 µm" from the center locus $CN_1$ in the plus direction of the X-axis of the X-Y coordinate system.

According to the present invention, there is no concept of a size of pixel. In other words, the multi-exposure drawing method and the multi-exposure drawing apparatus according to the present invention can cope with raster-graphic bit-data having various sizes of pixel. Namely, even if the raster-graphic bit data does not have any pixel size, it is possible to draw a pattern based on the raster graphic bit-data.

For example, when raster-graphic bit-data have a pixel size of 20×20 µm, and when a value of "1" is given to any one bit-datum, a pixel-dot area of 20×20 µm is produced on the X-Y surface, and therefore, the drawing surface 32, based on the one bit-datum "1" in a multi-exposure manner. In particular, in the example shown in FIG. 8 or FIG. 9, the 256 (16×16) micro-mirror elements, corresponding to the 256 center loci included in the pixel-dot area of 20×20 µm, are operated based on the same one bit-datum "1", and thus the pixel-dot area of 20×20 µm is produced on the drawing surface 32 by being subjected to the 256 exposure times.

In another example, when raster-graphic bit-data have a pixel size of 10×10 µm, and when a value of "1" is given to any one bit-datum, a pixel-dot area of 10×10 µm is produced on the drawing surface 32 based on the one bit-datum "1" in a multi-exposure manner. Namely, the 64 (8×8) micro-mirror elements, corresponding to the 64 center loci included in the pixel-dot area of 10×10 µm, are operated based on the same one bit-datum "1", and thus the pixel-dot area of 10×10 µm is produced by being subjected to the 64 exposure times.

In yet another example, when raster-graphic bit-data have a pixel size of 30×30 µm, and when a value of "1" is given to any one bit-datum, a pixel-dot area of 30×30 µm is produced on the drawing surface 32 based on the one bit-datum "1" in a multi-exposure manner. Namely, the 576 (24×24) micro-mirror elements, corresponding to the 64 center loci included in the pixel-dot area of 30×30 µm, are operated based on the same one bit-datum "1", and thus the pixel-dot area of 30×30 µm is produced by being subjected to the 576 exposure times.

Note, an exposure time is defined as a time during which a driven micro-mirror element remains in the exposure-reflecting position, and is suitably selected based on the number of exposure times for producing a pixel-dot area, the sensitivity of the photoresist layer, the light intensity of the light beam emitted from the light source device 22, and so on, so that a proper exposure level can be obtained for a pixel-dot area.

Figure 10:
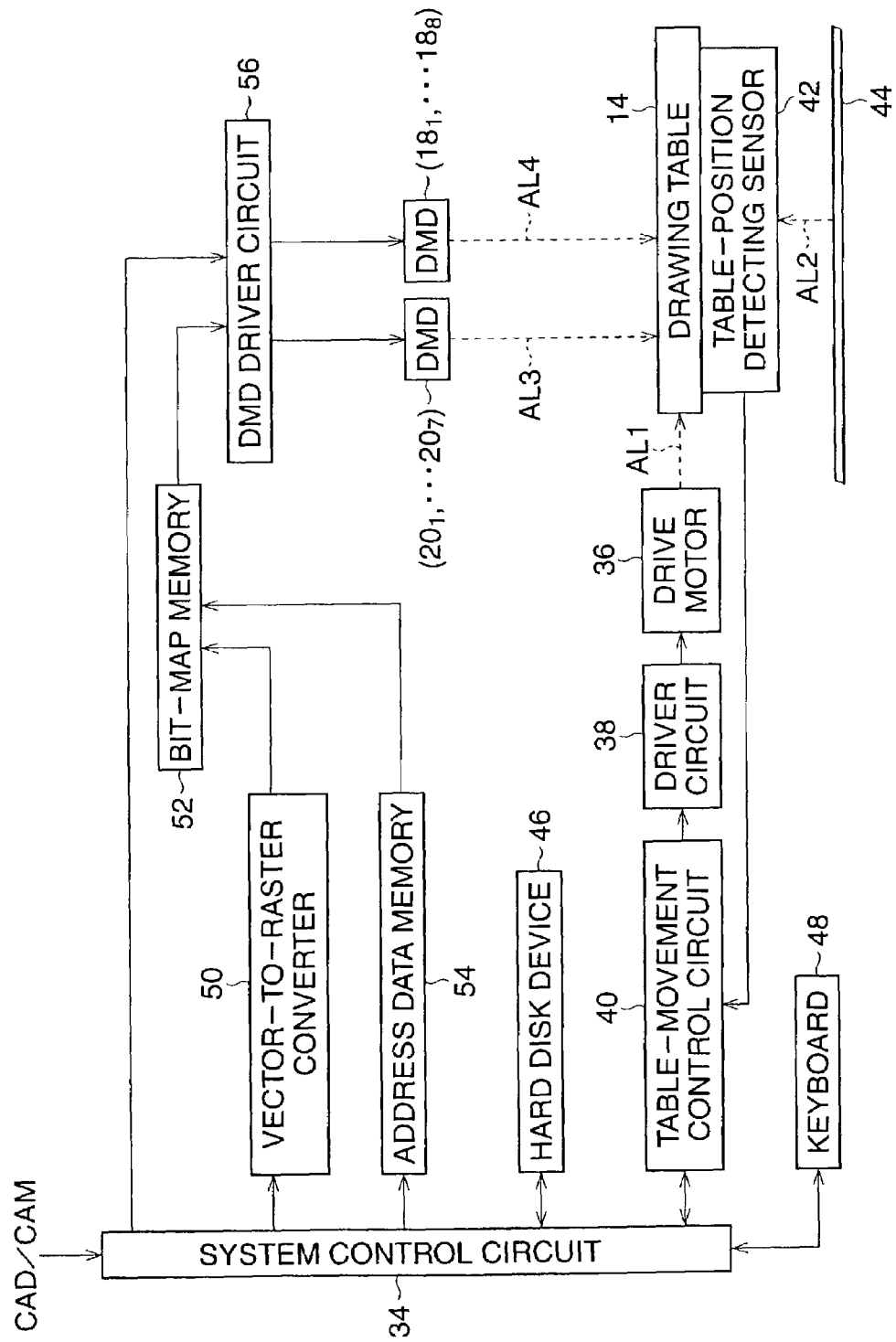
FIG. 10 is a block diagram of the multi-exposure drawing apparatus according to the present invention.

Referring to FIG. 10, a block diagram of the multi-exposure drawing apparatus is schematically shown. The apparatus includes a system control circuit 34 which is constituted by a microcomputer comprising a central processing unit (CPU), a read-only memory (ROM) for storing programs and constants, a random-access memory (RAM) for storing temporary data, and an input/output interface circuit (I/O).

In FIG. 10, reference 36 indicates the drive motor for moving the drawing table 14, and therefore the drawing surface 32, along the pair of guide rails 12. As mentioned above, although the suitable drive mechanism is located between the drawing table 14 and the drive motor 36, it is symbolically represented by an arrow-headed broken line AL1.

In this embodiment, the drive motor 36 comprises a stepping motor. The stepping motor 36 is driven by a driver circuit 38, which is operated by a table-movement control circuit 40. To precisely and accurately control the movement of the drawing table 14, the table-movement control circuit 40 is connected to a table-position detecting sensor 42 securely attached to the drawing table 14, and the table-position detecting sensor 42 is associated with a linear-scale 44 securely provided on the base structure 10 and arranged along the pair of guide rails 12.

In particular, for example, the table-position detecting sensor 42 includes a light emitter having a light emitting diode (LED), and a light receiver having a photodiode. The linear-scale 44 has a plurality of divisions which represent a distance, along which the drawing table 14 is moved along the pair of guide rails 12, and each of the fine divisions of the linear-scale 44 is formed as a fine reflective area. During the movement of the drawing table 14, while the light emitter of the sensor 42 emits a light toward the division of the linear-scale 44, the light receiver of the table-position detecting sensor 42 receives the light reflected from each division of the linear-scale 44. Note, in FIG. 10, the reflected light is symbolically represented by an arrow-headed broken line AL2.

The table-position detecting sensor 42 produces a series of clock pulses based on the received light, and the clock pulses are output to the table-movement control circuit 40, which operates the driver circuit 38 based on the clock pulses, whereby a series of drive clock pulses is output from the driver circuit 38 to the stepping motor 36. Thus, it is possible to control the movement of the drawing table 14 according to the precision of the divisions of the linear-scale 44.

As shown in FIG. 10, the table-movement control circuit 40 is connected to the system control circuit 34, and is thus operated under the control of the system control circuit 34. Also, the clock pulses, output from the table-position detecting sensor 42, are fed to the system control circuit 34 via the table-movement control circuit 40, and thus it is possible for the system control circuit 34 to recognize and monitor the position of the drawing table 14 during the movement of the drawing table 14 along the pair of guide rails 12.

The system control circuit 34 is connected to a LAN (local area network) through the I/O, and is further connected to a CAD (Computer Aided Design) station for designing a circuit pattern and a CAM (Computer Aided Manufacturing) station for editing the designed circuit pattern through the LAN. A circuit pattern to be drawn is processed as vector-graphic data by the CAD station and/or the CAM station. The vector-graphic data or circuit pattern data is fed from either the CAD station or CAM station to the system control circuit 34 through the LAN, if necessary.

The system control circuit 34 is provided with a hard disk device 46 connected thereto through the I/O. Whenever the system control circuit 34 receives the circuit pattern data (vector-graphic data) from either the CAD station or CAM station, the circuit pattern data is stored in the hard disk device 46. The apparatus includes a keyboard 48 which is connected to the system control circuit 34 through the I/O to input various commands and various data to the system control circuit 34.

In FIG. 10, reference 50 indicates a vector-to-raster converter 50, and reference 52 indicates a bit-map memory. Prior to a drawing operation, a series of vector-graphic circuit pattern data is read from the hard disk device 46, and is fed to the vector-to-raster converter 50, in which the vector-graphic circuit pattern data is converted into raster-graphic circuit pattern bit-data. The converted raster-graphic bit-data is successively output from the vector-to-raster converter 50 to the bit-map memory 52, in which the raster-graphic bit-data are developed and stored.

Note, the reading of the vector-graphic bit-data from the hard disk device 46, the conversion of the vector-graphic data into the raster-graphic bit-data by the converter 50, and the storage of the raster-graphic bit-data in the bit-map memory 52 and so on are performed in accordance with command signals input to the system control circuit 34 by operating the keyboard 48.

In FIG. 10, reference 54 indicates an address data memory, which stores address data for reading raster-graphic bit-data from the bit-map memory 52. While the exposure operations are performed by the DMD units $18_1$ to $18_8$ and $20_1$ to $20_7$, given address data are successively output from the address data memory 54 to the bit-map memory 52 under control of the system control circuit 34, and the raster-graphic bit-data successively are read from the bit-map memory 54 in accordance with the address data. Note, during the exposure operations by the DMD units $18_1$ to $18_8$ and $20_1$ to $20_7$, the address data are successively produced by the system control circuit 34, and the address data are rewritten in the address data memory 54 with the successively-produced address data, as stated in detail hereinafter.

In FIG. 10, reference 56 indicates a DMD driver circuit for operating the DMD units $18_1$ to $18_8$ and $20_1$ to $20_7$. As is apparent from FIG. 10, the DMD units $18_1$ to $18_8$, included in the first array, are represented as a block, and the DMD units $20_1$ to $20_7$, included in the second array, are also represented as a block. The DMD driver circuit 56 outputs a series of driver signals to each DMD unit ($18_1, \ldots, 18_8$; $20_1, \ldots, 20_7$), and the exposure operations are performed by each DMD unit in accordance with the driver signals. Note, in FIG. 10, the exposure operation, performed by the DMD units $18_1$ to $18_8$, is symbolically represented by the arrow-headed broken line AL3, and the exposure operation, performed by the DMD units $20_1$ to $20_7$, is symbolically represented by the arrow-headed broken line AL4.

Figure 11:
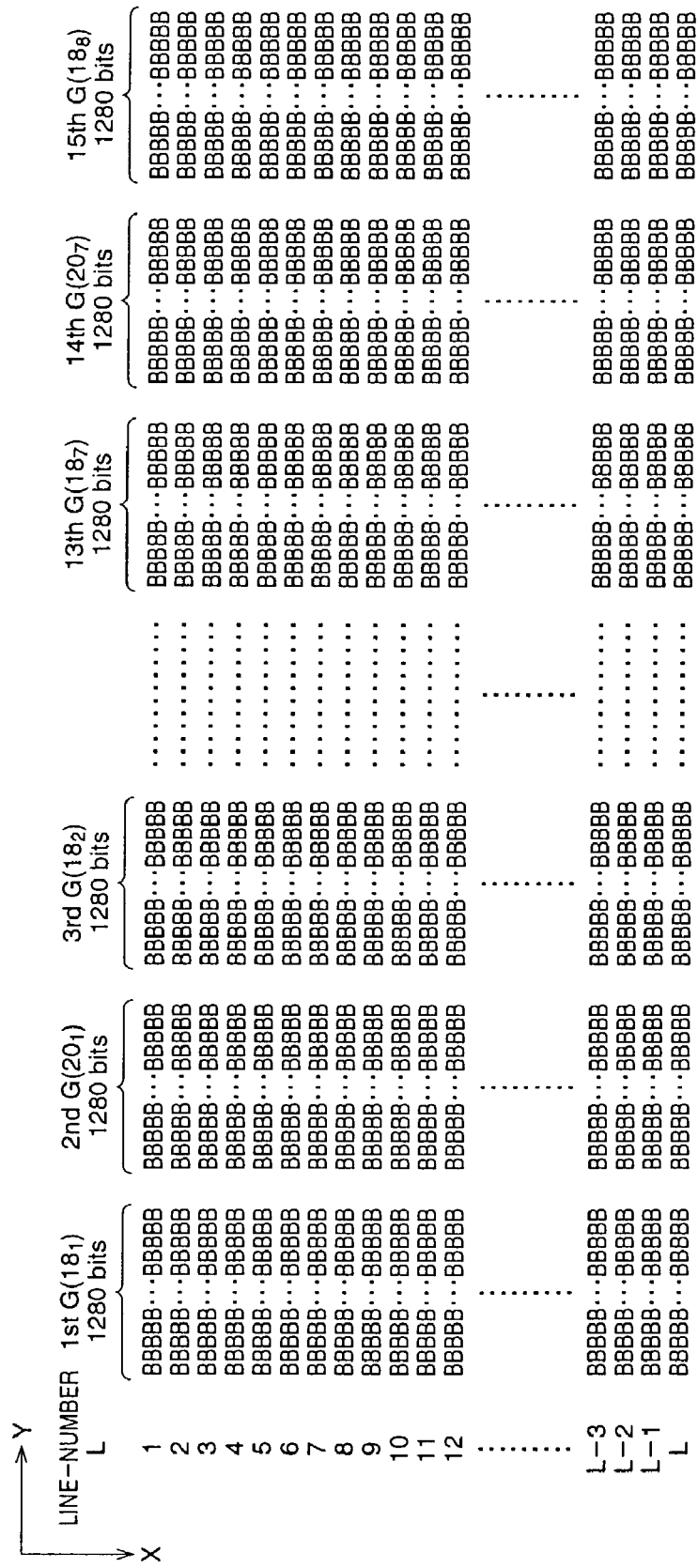
FIG. 11 is a conceptual view showing raster-graphic data developed and stored in a bit-map memory incorporated in the multi-exposure drawing apparatus.

Referring to FIG. 11, a part of the circuit pattern bit data (raster-graphic data), stored and developed in the bit-map memory 52, is conceptually shown. The circuit pattern bit-data comprises a plurality of lateral bit-data lines, indicated by a line-number "L", and each line includes 1280×15 bit-data. The lateral bit-data lines correspond to lateral drawing-lines to be successively drawn on the drawing surface 32 along the Y-axis of the X-Y coordinate system. Namely, a lateral bit-data line, indicated by a line-number "L", corresponds to the number of a lateral drawing-line to be drawn on the drawing surface 32. Note, in FIG. 11, each reference "B" represents one bit-datum, to which a value of either "0" or "1" is given.

As shown in FIG. 11, the 1280×15 bit-data, included in each lateral bit-data line, are divided into fifteen groups: first, second, third, . . . , thirteenth, fourteenth, and fifteenth groups, and each group includes a plurality of lateral bit-data lines of 1280 bit-data. The DMD units $18_1$ to $18_8$, included in the first array, are operated based on the bit-data included in the respective odd-numbered groups (1st G, 3rd G, . . . , 13th G, and 15th G), and the DMD units $20_1$ to $20_7$, included in the second array, are operated based on the bit-data included in the respective even-numbered groups (2nd G, 4th G, . . . , 12th G, and 14th G).

Figures 12, 13:
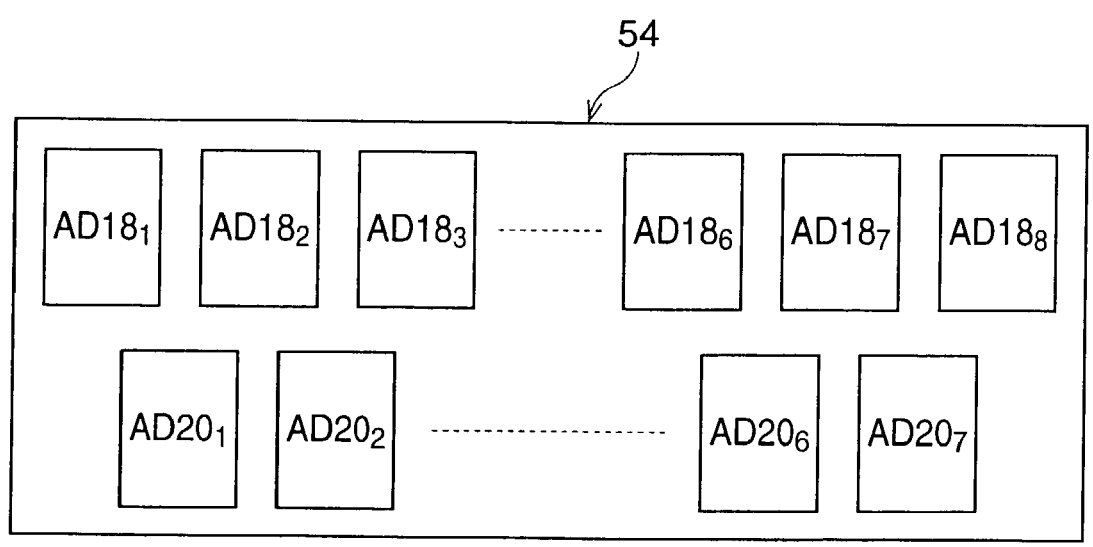
FIG. 12 is a table conceptually showing a relationship between bit-data, stored in the bit-map memory, and address data for identifying each bit-datum.
FIG. 13 is a conceptual view showing memory areas defined in an address data memory incorporated in the multi-exposure drawing apparatus.

As conceptually shown in FIG. 12, in each group (1st G, 2nd G, . . . , 14th G, and 15th G), address data [$L_x$, $R_y$] are allocated to an individual bit-datum "B". The address data [$L_x$, $R_y$] are composed of a line-number data component "$L_x$," and a bit-number data component "$R_y$". The line-number data component "$L_x$" indicates a line-number in which the bit-datum "B" concerned is included, and the bit-number data component "$R_y$" indicates a bit-number of the bit-datum "B" concerned, which is counted from the first or spearhead bit-datum "B" of the line-number indicated by the line-number data component "$L_x$". For example, if $L_x$=000001, and if $R_y$=0001, the address data [000001, 0001] identify the first bit-data "B" of the first-line "L=000001" as a bit-datum to be read from each group of the bit-map memory 52. Also, if $L_x$=000003, and if $R_y$=0001, the address data [000003, 0001] identify the first bit-data "B" of the third-line "L=000003" as a bit-datum to be read from each group of the bit-map memory 52. Further, if $L_x$=000003, and if $R_y$=1278, the address data [000003, 1278] identify the 127$^{th}$ bit-data "B" of the third-line "L=000003" as a bit-datum to be read from each group of the bit-map memory 52. Furthermore, if $L_x$=000003, and if $R_y$=1280, the address data [000003, 1280] identify the last bit-data "B" of the third-line "L=000003" as a bit-datum to be read from each group of the bit-map memory 52.

As conceptually shown in FIG. 13, the address data memory 54 includes eight memory areas $AD18_1$ to $AD18_8$, and seven memory areas $AD20_1$ to $AD20_7$. The respective eight memory areas $AD18_1$ to $AD18_8$ are provided for storing the address data $[L_x, R_y]$ to be output to the odd-numbered groups (1st G, 3rd G, . . . , 13th G, and 15th G) of the bit-map memory 52. The respective seven memory areas $AD20_1$ to $AD20_7$ are provided for storing the address data $[L_x, R_y]$ to be output to the even-numbered groups (2nd G, 4th G, . . . , 12th G, and 14th G) of the bit-map memory 52. For example, when the address data [000001, 00011] are output from the memory area $AD18_1$ to the first group (1st G) of the bit-map memory 52, the first bit-data "B" of the first-line "L=000001" is read from the first group (1st G) of the bit-map memory 52, and is then fed to the DMD driver circuit 56. Also, when the address data [000003, 1278] are output from the memory area $AD18_1$ to the first group (1st G) of the bit-map memory 52, the $127^{th}$ bit-data "B" of the third-line "L=000003" is read from the first group (1st G) of the bit-map memory 52, and is then fed to the DMD driver circuit 56. Note, for example, each memory area ($AD18_1, \ldots, AD18_8; AD20_1, \ldots, AD20_7$) has the capacity to store the address data $[L_x, R_y]$ necessary for reading the 1024 lines of bit-data "B" from each group of the bit-map memory 52.

As already stated, according to the present invention, there is no concept of a size of pixel. Thus, when a circuit pattern is designed on the CAD or CAM station, it is possible to optionally determine a pixel size of the circuit pattern to be designed. For example, when the designed circuit pattern data (vector-graphic data) have one pixel-size of 10×10 μm, it is possible to produce one pixel-dot area of 10×10 μm on the drawing surface for drawing the circuit pattern thereon. Also, when the designed circuit pattern data have one pixel-size of 20×20 μm, it is possible to produce one pixel-dot area of 20×20 μm on the drawing surface for drawing the circuit pattern thereon. Further, when the designed circuit pattern data have one pixel-size of 30×30 μm, it is possible to produce one pixel-dot area of 30×30 μm on the drawing surface for drawing the circuit pattern thereon. Furthermore, when the designed circuit pattern data have one pixel-size of 40×40 μm, it is possible to produce one pixel-dot area of 40×40 μm on the drawing surface for drawing the circuit pattern thereon.

Figure 14:
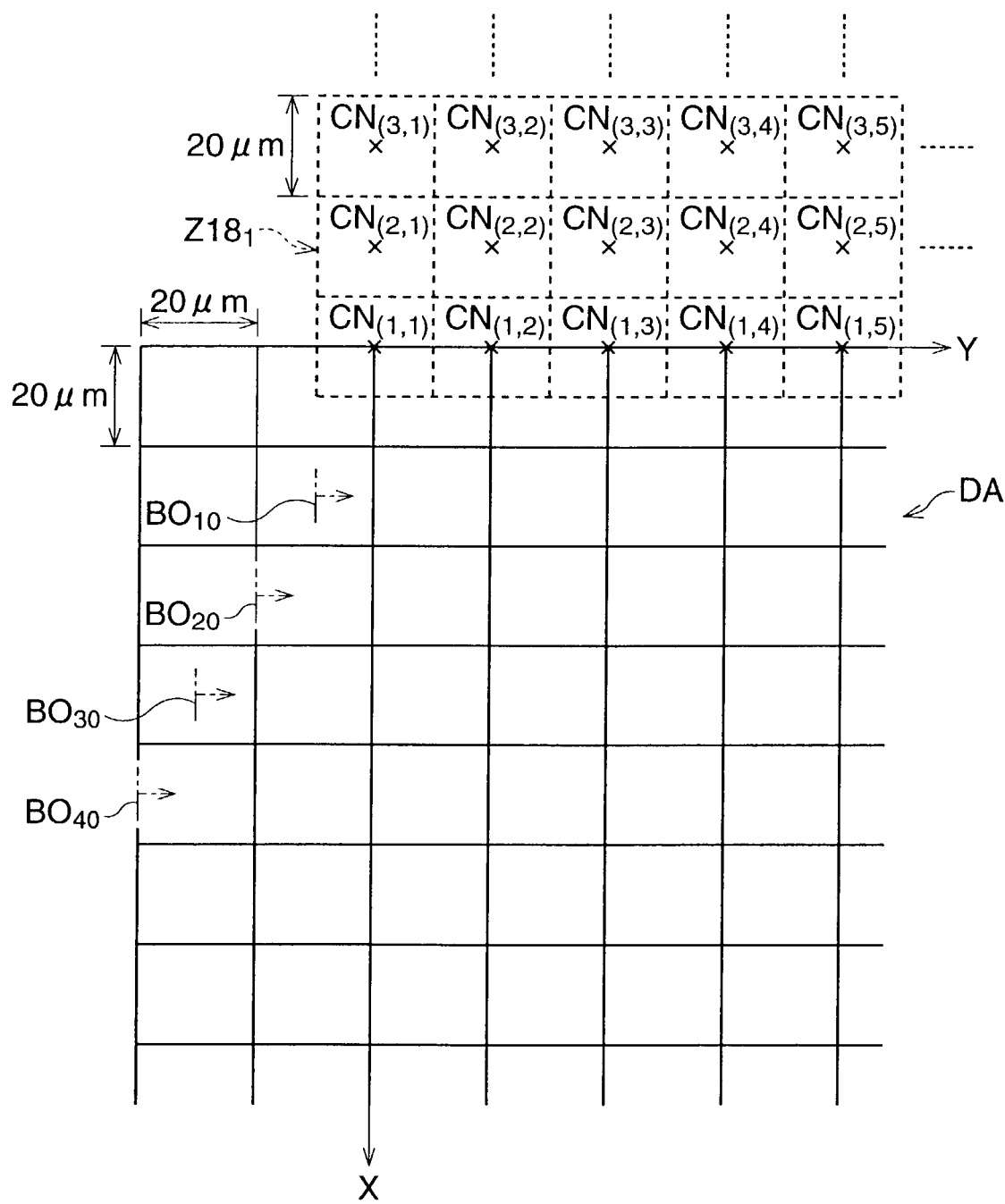
FIG. 14 is a conceptual view showing a relationship between the DMD unit and a circuit pattern drawing area, the DMD unit being positioned at a drawing-start position in relation to the circuit pattern drawing area.

Referring to FIG. 14, similar to FIG. 4(A), a part of a full exposure zone, which is to be projected on the X-Y surface of the X-Y coordinate system when all the micro-mirror elements of the DMD unit $18_1$ are operated at the first exposure-operation position or drawing-start position (DSP), is shown by broken lines. The center loci of the unit exposure zones $U_{(1,1)}$, $U_{(1,2)}$, $U_{(1,3)}$, $U_{(1,4)}$, and $U_{(1,5)}$ (FIG. 4(A)) are represented by symbols "x", and are indicated by references $CN_{(1,1)}$, $CN_{(1,2)}$, $CN_{(1,3)}$, $CN_{(1,4)}$, and $CN_{(1,5)}$. Similarly, the center loci of the unit exposure zones $U_{(2,1)}$, $U_{(2,2)}$, $U_{(2,3)}$, $U_{(2,4)}$, and $U_{(2,5)}$ (FIG. 4(A)) are represented by symbols "x", and are indicated by references $CN_{(2,1)}$, $CN_{(2,2)}$, $CN_{(2,3)}$, $CN_{(2,4)}$, and $CN_{(2,5)}$, and the center loci of the unit exposure zones $U_{(3,1)}$, $U_{(3,2)}$, $U_{(3,3)}$, $U_{(3,4)}$, and $U_{(3,5)}$ (FIG. 4(A)) are represented by symbols "x", and are indicated by references $CN_{(3,1)}$, $CN_{(3,2)}$, $CN_{(3,3)}$, $CN_{(3,4)}$ and $CN_{(3,5)}$. Since the DMD unit $18_1$ is at the drawing-start position (DSP) or first exposure-operation position (FIG. 4(A)), the center loci $CN_{(1,1)}$, $CN_{(1,2)}$, $CN_{(1,3)}$, $CN_{(1,4)}$, and $CN_{(1,5)}$ are positioned on the Y-axis of the X-Y coordinate system.

Also, as shown in FIG. 14, a part of a circuit pattern drawing area DA, defined on the X-Y surface or drawing surface 32, is sectioned into areas of 20×20 μm, for the sake of convenience of explanation. When the DMD unit $18_1$ is at the drawing-start position (DSP) or first exposure-operation position, a lateral leading boundary of the circuit pattern drawing area DA coincides with the Y-axis of the X-Y coordinate system.

Figure 15:
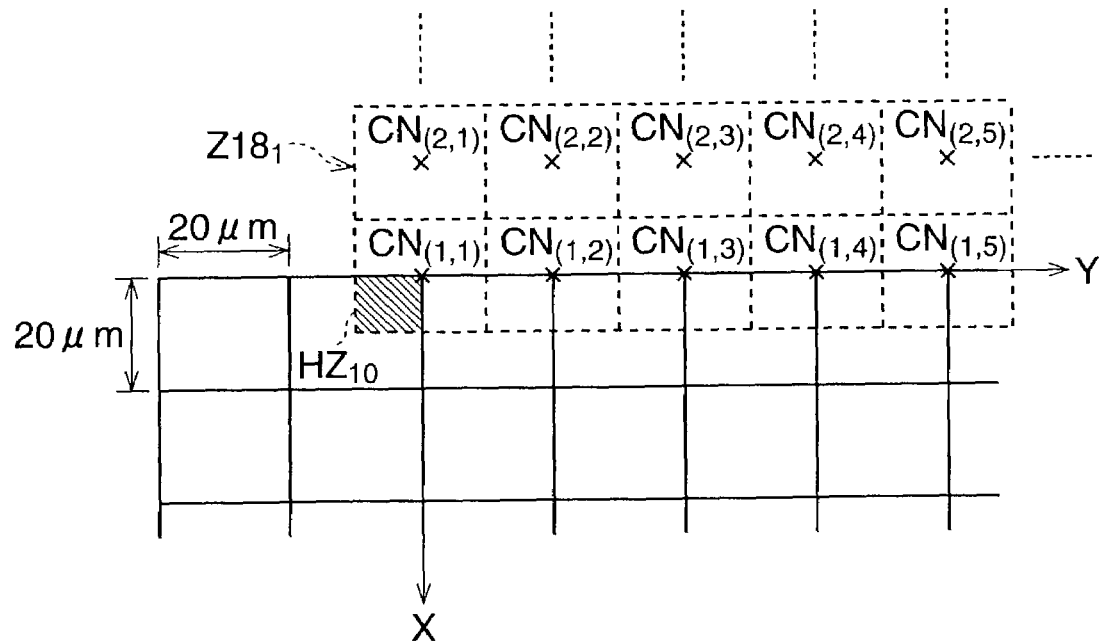
FIG. 15 is a conceptual view, similar to FIG. 14, showing a pixel-dot area as a hatched area defined on the circuit pattern drawing area when the circuit pattern data to be drawn have a pixel-size of 10×10 μm.

As shown in FIG. 15, when the circuit pattern data have the pixel-size of 10×10 μm, a pixel-dot area or hatched area $HZ_{10}$ is defined by the first bit-data "B" of the first-line "L=1", which is included in the first group (1st G) of the bit-map memory 52 (FIG. 11), and which is identified by the address data [000001, 0001] (FIG. 12). Also, in this case, as shown in FIG. 14, a left side boundary of the circuit pattern drawing area DA is defined on the drawing surface, as indicated by reference $BO_{10}$.

Figure 16:
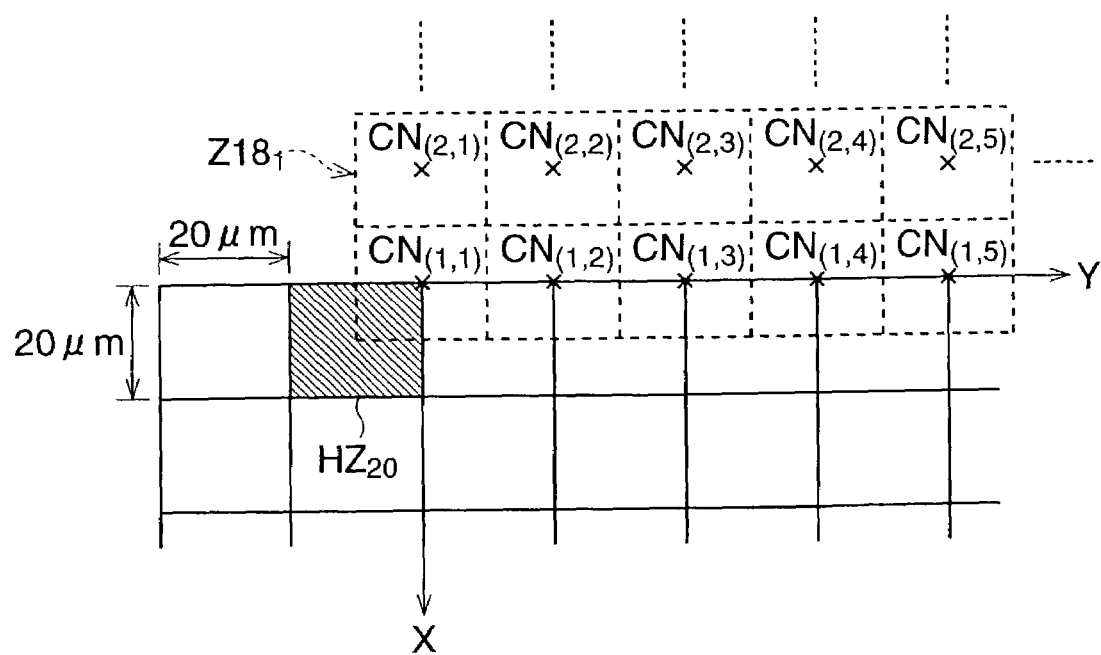
FIG. 16 is a conceptual view, similar to FIG. 14, showing a pixel-dot area as a hatched area defined on the circuit pattern drawing area when the circuit pattern data to be drawn have a pixel-size of 20×20 μm.

As shown in FIG. 16, when the circuit pattern data have the pixel-size of 20×20 μm, a pixel-dot area or hatched area $HZ_{20}$ is defined by the first bit-data "B" of the first-line "L=1", which is included in the first group (1st G) of the bit-map memory 52 (FIG. 11), and which is identified by the address data [000001, 0001] (FIG. 12). Also, in this case, as shown in FIG. 14, a left side boundary of the circuit pattern drawing area DA is defined on the drawing surface, as indicated by reference $BO_{20}$.

Figure 17:
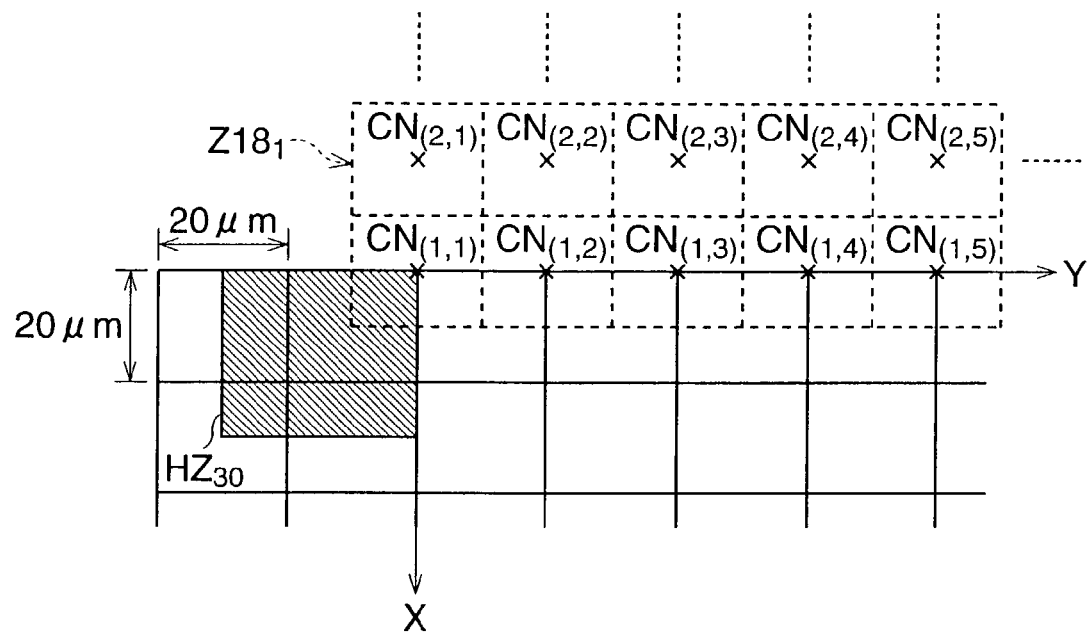
FIG. 17 is a conceptual view, similar to FIG. 14, showing a pixel-dot area as a hatched area defined on the circuit pattern drawing area when the circuit pattern data to be drawn have a pixel-size of 30×30 μm.

As shown in FIG. 17, when the circuit pattern data have the pixel-size of 30×30 μm, a pixel-dot area or hatched area $HZ_{30}$ is defined by the first bit-data "B" of the first-line "L=1", which is included in the first group (1st G) of the bit-map memory 52 (FIG. 11), and which is identified by the address data [000001, 0001] (FIG. 12). Also, in this case, as shown in FIG. 14, a left side boundary of the circuit pattern drawing area DA is defined on the drawing surface, as indicated by reference $BO_{30}$.

Figure 18:
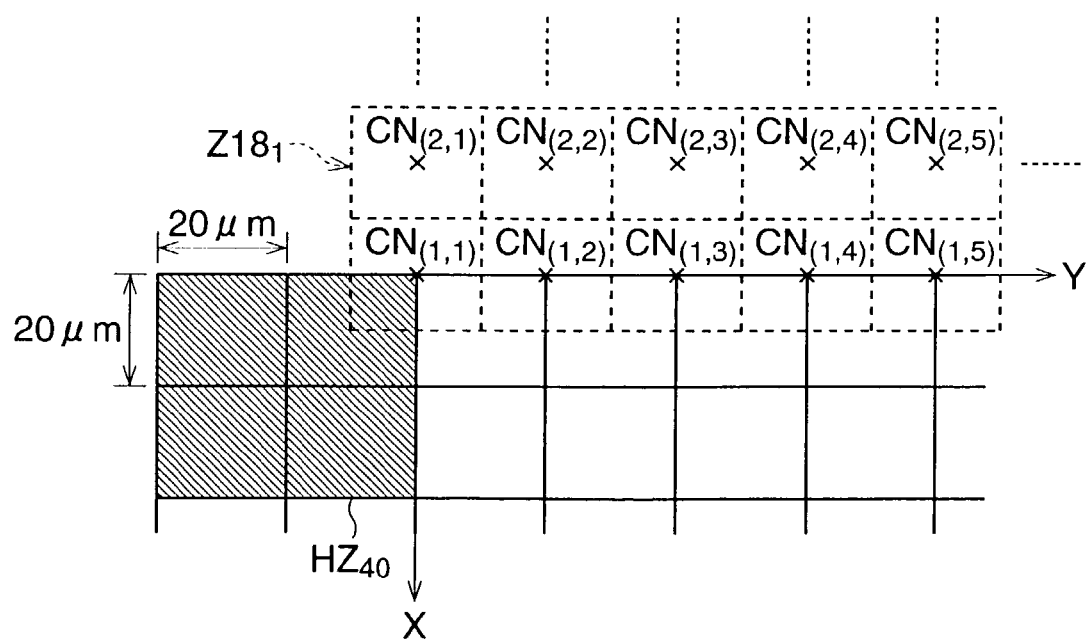
FIG. 18 is a conceptual view, similar to FIG. 14, showing a pixel-dot area as a hatched area defined on the circuit pattern drawing area when the circuit pattern data to be drawn have a pixel-size of 40×40 μm.

As shown in FIG. 18, when the circuit pattern data have the pixel-size of 40×40 μm, a pixel-dot area or hatched area $HZ_{40}$ is defined by the first bit-data "B" of the first-line "L=1", which is included in the first group (1st G) of the bit-map memory 52 (FIG. 11), and which is identified by the address data [000001, 0001] (FIG. 12). Also, in this case, as shown in FIG. 14, a left side boundary of the circuit pattern drawing area DA is defined on the drawing surface, as indicated by reference $BO_{40}$.

Accordingly, it is necessary to previously determine what bit-datum "B" should be used to operate each micro-mirror element, included in each DMD unit ($18_1, \ldots, 18_8; 20_1, \ldots, 20_7$), with respect to each pixel-dot area (10×10 μm, 20×20 μm, 30×30 μm, 40×40 μm) of the circuit pattern, before the circuit pattern can be drawn on the drawing surface 32 with a proper pixel-size (10×10 μm, 20×20 μm, 30×30 μm, 40×40 μm), as stated in detail below.

First, supposing that all the micro-mirror elements of the DMD unit $18_1$ are operated at the first exposure-operation position or drawing-start position (DSP), the 1024×1280 unit exposure zones $U_{(n,m)}$ are produced on the X-Y surface of the X-Y coordinate system. In this case, a center locus $CN_{(n,m)}$ of each unit exposure zone $U_{(n,m)}$ is represented by the following X-Y coordinates:

$$P_{[x(n),y(m)]} (1 \leq n \leq 1024 \text{ and } 1 \leq m \leq 1280)$$

As mentioned above, the DMD unit $18_1$ is intermittently moved from the first exposure-operation position in the counter direction to the movement-direction AR of the drawing table 14 at the regular intervals of "A+a". When the DMD unit $18_1$ reaches an $i^{th}$ exposure-operation position, both the X component x(n) and the Y component y(m) of the X-Y coordinates $P_{[x(n),y(m)]}$ are defined as follows:

$$X(n)=(i-1)(A+a)-(n-1)C \quad (1)$$

$$Y(m)=(m-1)C-(i-1)b \quad (2)$$

Herein: C is a dimension of a size of each unit exposure zone $U_{(n,m)}$. In this example, C=20 μm. Also, as stated above, in this example, A=4*C=80 μm, a=1.25 μm, b=0.078125 μm.

At the $i^{th}$ exposure-operation position, when the X-Y coordinates $P_{[x(n),y(m)]}$, corresponding to each of the micro-mirror elements in the DMD unit $18_1$, are encompassed by a pixel-dot area ($HZ_{10}$, $HZ_{20}$, $HZ_{30}$, $HZ_{40}$), address data [$L_x$, $R_y$], which identify a bit-datum "B" corresponding to the pixel-dot area ($HZ_{10}$, $HZ_{20}$, $HZ_{30}$, $HZ_{40}$) concerned, are determined based on the equations (1) and (2) as follows:

$$L_x=INT[x(n)/P_s]+1 \quad (3)$$

$$R_y=INT[y(m)/P_s]+1 \quad (4)$$

Herein: the calculation factor INT[e/f] represents the quotient of the bracketed division "e/f" (if e<f, INT[e/f]=0); and "$P_s$" is a dimension of the pixel-dot area ($HZ_{10}$, $HZ_{20}$, $HZ_{30}$, $HZ_{40}$). In this example, "$P_s$" is any one of the dimensions "10 μm", "20 m", "30 μm", and "40 μm".

Thus, the bit-datum "B", which is identified by the address data [$L_x$, $R_y$] determined by the equations (3) and (4), is used to operate the micro-mirror element, corresponding to the coordinates $P_{[x(n),y(m)]}$ concerned, whereby it is possible to draw a circuit pattern on the drawing surface 32 with a proper pixel-size (10×10 μm, 20×20 μm, 30×30 μm, 40×40 μm).

If the X component x(n) of the X-Y coordinates $P_{[x(n),y(m)]}$ is negative (X(n)<0), i.e. if the calculation result of the equation (1) is negative, the calculation result (X(n)<0) means that the center locus $CN_{(n,m)}$, represented by the X-Y coordinates $P_{[x(n),y(m)]}$ concerned, has still not reached the drawing-start position (DSP) or Y-axis of the X-Y coordinate system. Of course, in this case, since there is no bit-datum for operating the micro-mirror element corresponding to the center locus $CN_{(n,m)}$ concerned, the micro-mirror element concerned is operated based on a dummy bit-datum "0".

Also, when the Y component y(m) of the X-Y coordinates $P_{[x(n),y(m)]}$, i.e. the calculation result of the equation (2) fulfills the following conditions:

$$Y(m)<0, \text{ and } |y(m)|>P_s$$

the calculation result means that that the center locus $CN_{(n,m)}$, represented by the X-Y coordinates $P_{[x(n),y(m)]}$ concerned, crosses beyond a left side boundary of the circuit pattern drawing area DA, as indicated by any one of references $BO_{10}$, $BO_{20}$, $BO_{30}$, and $BO_{40}$ in FIG. 14. In this case, there is no bit-datum for operating the micro-mirror element corresponding to the center locus $CN_{(n,m)}$ concerned, and thus the micro-mirror element concerned is operated based on a dummy bit-datum "0".

The aforesaid explanation regarding the DMD unit $18_1$ is true for the remaining DMD units $18_2$ to $18_1$, except that it should be taken into consideration that each of the remaining DMD units $18_2$ to $18_8$ is spaced from the DMD unit $18_1$ by a given distance in the plus direction of the Y-axis of the X-Y coordinate system.

Also, the aforesaid explanation regarding the DMD unit $18_1$ is true for the DMD units $20_1$ to $20_7$ included in the second array, except that it should be taken into consideration that not only is each of the DMD units $20_1$ to $20_7$ spaced from the DMD unit $18_1$ by a given distance in the plus direction of the Y-axis of the X-Y coordinate system, but also it is spaced from the DMD unit $18_1$ by a given distance in the movement direction AR of the drawing table 14.

Figure 19:
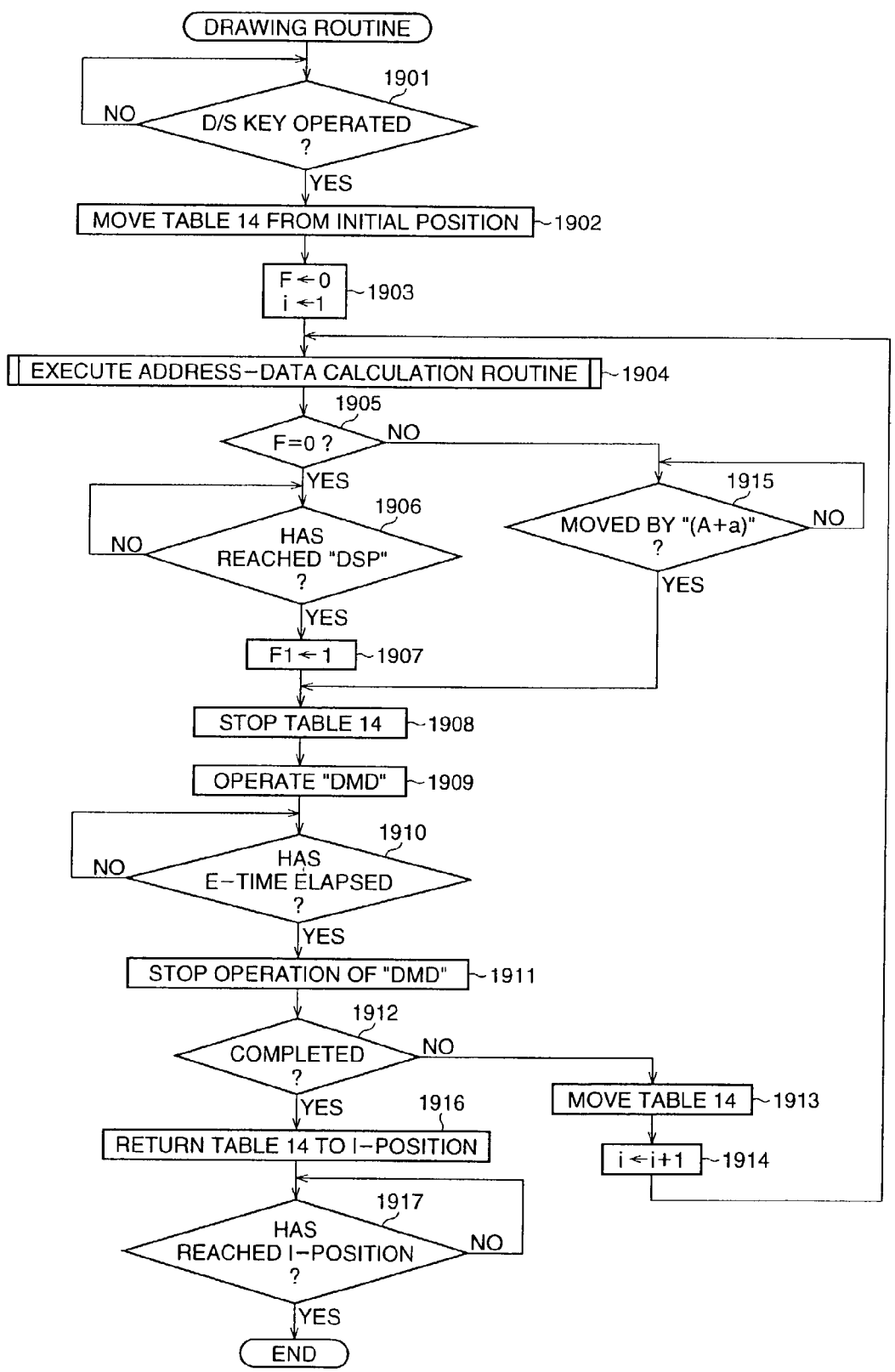
FIG. 19 is a flowchart of a drawing routine executed in a system control circuit of the multi-exposure drawing apparatus.

FIG. 19 shows a flowchart of a drawing routine executed in the system control circuit 34. The execution of the drawing routine is started by turning ON a power ON/OFF switch (not shown) of the apparatus.

Note, it is supposed that raster-graphic circuit pattern data for drawing a circuit pattern are already developed and stored in the bit-map memory 52, as shown in FIG. 11, and that various data (e.g. distance data "A" "a", and "b", exposure time data, velocity data for the drawing table 14, and so on) necessary to execute the drawing routine are already input to the RAM of the system control circuit 34 through the keyboard 48.

At step 1901, it is monitored whether a drawing-start key on the keyboard 48 has been operated. When the operation of the drawing-start key is confirmed, the control proceeds to step 1902, in which the stepping motor 36 is driven so that the drawing table 14 is moved from an initial or home position toward the bridge-like structure 16 in the movement direction AR. In other words, both the first array of DMD units $18_1$ to $18_8$ and the second array of DMD units, $20_1$ to $20_7$ are moved in the counter direction to the movement direction AR in relation to a workpiece placed on the drawing table 14.

Note, of course, when the drawing table 14 is at the initial or home position, an initial position of the workpiece, placed on the drawing table 14, is previously specified with respect to the X-Y coordinate system, and is input as initial position data to the system control circuit 34 through the keyboard 48.

At step 1903, a flag F is initialized to "0", and a counter "i" is initialized to "1". The flag F is provided for indicating whether the workpiece on the drawing table 14 has reached a drawing-start position (DSP) or first exposure-operation position, and the flag F is changed from "0" to "1" when the arrival of the workpiece at the first exposure-operation position is confirmed, as stated hereinafter. Also, the counter "i" counts a number of exposure-operation positions that the workpiece has reached. Namely, a count value of the counter "i" is incremented by "1" whenever workpiece reaches an exposure-operation position, as stated hereinafter.

Note, when the workpiece reaches the first exposure-operation position, a lateral leading boundary of a circuit pattern drawing area (DA), defined on the workpiece, coincides with the X-axis of the X-Y coordinate (FIG. 14), as already stated above.

At step 1904, an address-data calculation routine is executed as a subroutine to calculate the address data [$L_x$, $R_y$] for bit-data "B" to be read from the bit-map memory 52 when an exposure operation is performed at the first exposure-operation position. The calculated address data [$L_x$, $R_y$] are successively written and stored in the memory areas ($AD18_1$ to $AD18_8$, and $AD20_1$ to $AD20_7$) of the address data memory 54. Note, the address-data calculation routine will be explained in detail with reference to FIG. 20.

At step 1905, it is determined whether the flag F is "0" or "1". At this initial stage, since F=0, the control proceeds to step 1906, in which it is monitored whether the workpiece on the drawing table 14 has reached the drawing-start position (DSP) or the first exposure-operation position. When the arrival of the workpiece at the first exposure-operation position is confirmed, the control proceeds to step

1907, in which the flag F is changed from "0" to "1". Then, at step 1908, the driving of the stepping motor 36 is stopped.

At step 1909, the address data [$L_x$, $R_y$], obtained by the execution of the address-data calculation routine (step 1904), are output from the address data memory 54 to the bit-map memory 52, and thus the bit-data "B", identified by address data [$L_x$, $R_y$], are output from the bit-map memory 52 to the DMD driver circuit 56, whereby the DMD units ($18_1$ to $18_8$, and $20_1$ to $20_7$) are operated based on the bit-data "B" output from the bit-map memory 52.

At step 1910, it is monitored whether the exposure time has elapsed. When the lapse of the exposure time is confirmed, the control proceeds to step 1911, in which the operation of the DMD units ($18_1$ to $18_8$, and $20_1$ to $20_7$) is stopped. Then, at step 1912, it is determined whether a drawing of the circuit pattern has been completed.

As stated above, at the first exposure-operation position, only the first line-alignment of 1280 micro-mirror elements in each DMD unit ($18_1$, ..., $18_8$) is operated based on the line of 1280 bit-data "B" included in a corresponding odd-numbered group of the bit-map memory 52, and the remaining line-alignments of 1280 micro-mirror elements in each DMD unit ($18_1$, ..., $18_8$) are operated based on the dummy bit data "0", because the remaining line-alignments of 1280 micro-mirror elements in each DMD units ($18_1$, ..., $18_8$) have still not entered the pattern drawing area (DA). Similarly, all the line-alignments of 1280 micro-mirror elements in each DMD units ($20_1$, ..., $20_7$) are operated based on the dummy bit data "0".

At step 1912, when the completion of the drawing of the circuit pattern is not confirmed, the control proceeds to step 1913, in which the stepping motor 36 is again driven so that the drawing table 14 is moved from the first exposure-operation position toward a second exposure-operation position. Then, at step 1914, the count value of the counter "i" is incremented by "1", and the control returns to step 1904.

At step 1904, the address-data calculation routine is again executed to calculate address data [$L_x$, $R_y$] for bit-data "B" to be read from the bit-map memory 52 when an exposure operation is performed at the second exposure-operation position (i=2). Then, at step 1905, it is determined whether the flag F is "0" or "1". At this stage, since F=1, the control proceeds from step 1905 to step 1915, in which it is monitored whether the drawing table 14 is moved by the distance "A+a".

When the movement of the drawing table 14 by the distance "A+a" is confirmed, the control proceeds from step 1915 to step 1908, in which the driving of the stepping motor 36 is again stopped. Then, at step 1909, the address data [$L_x$, $R_y$], obtained by the execution of the address-data calculation routine (step 1904, i=2), output from the address data memory 54 to the bit-map memory 52, and thus the bit-data "B", identified by address data [$L_x$, $R_y$], are output from the bit-map memory 52 to the DMD driver circuit 56, whereby the DMD units ($18_1$ to $18_8$, and $20_1$ to $20_7$) are operated based on the bit-data "B" output from the bit-map memory 56. Namely, whenever the drawing table 14 is moved by the intervals of "A+a", the exposure operation is repeated until the drawing of the circuit pattern is completed (step 1912).

At step 1912, when the completion of the drawing of the circuit pattern is confirmed, the control proceeds to step 1916, in which the stepping motor 36 is reversely driven, thereby moving the drawing table 14 toward the initial or home position. Then, at step 1917, it is monitored whether the drawing table 14 has returned to the initial or home position. When the return of the drawing table 14 to the initial or home position is confirmed, the routine ends.

Figure 20:
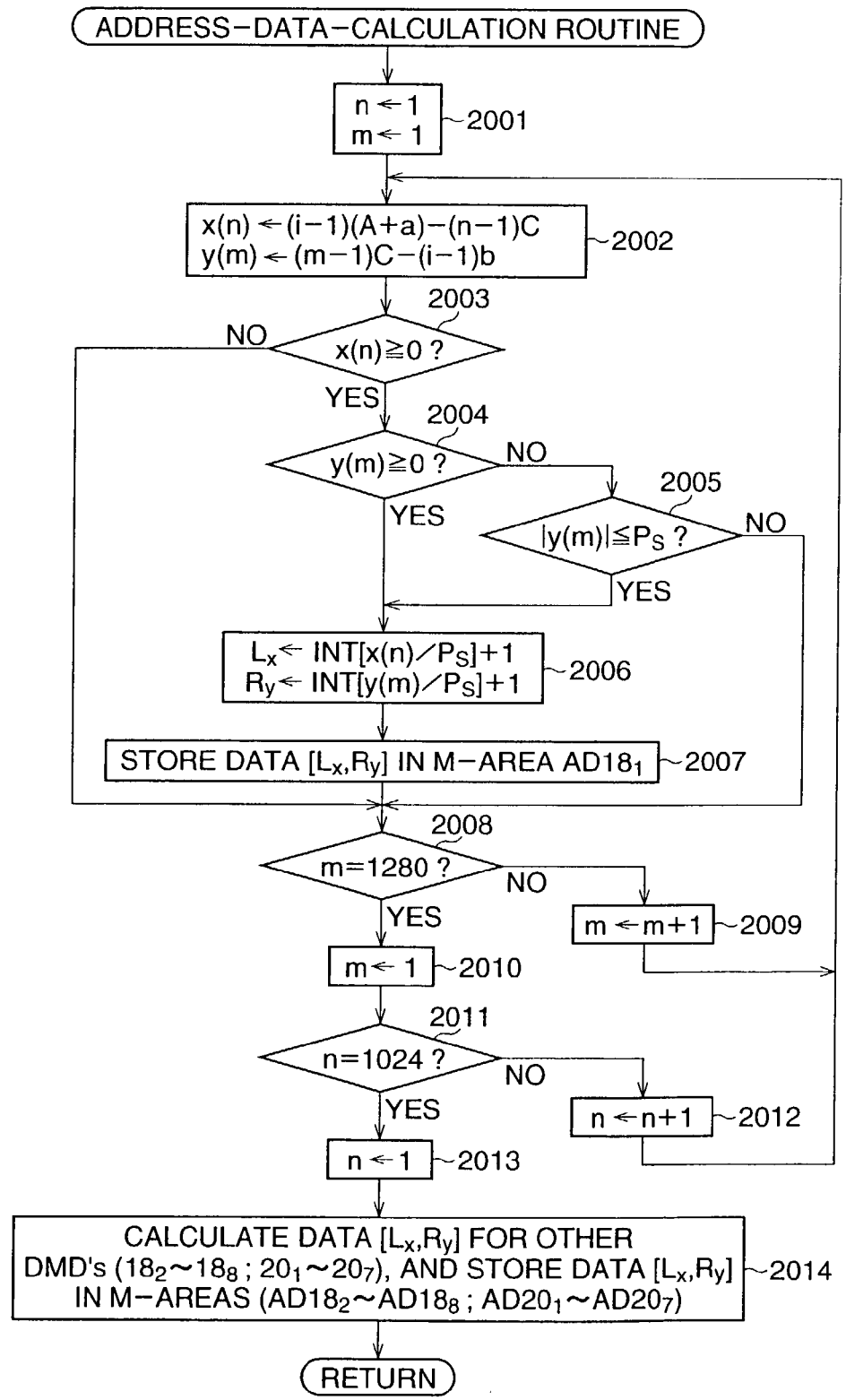
FIG. 20 is a flowchart of an address-data calculation routine executed as a subroutine in the drawing routine of FIG. 19.

FIG. 20 shows a flowchart of the address-data calculation routine repeatedly executed at step 1904 of the drawing routine of FIG. 19. Note, in this routine, steps 2001 to 2013 are directed to the calculation of the address data [$L_x$, $R_y$] for the operation of the DMD unit $18_1$. Namely, the calculation of the address data [$L_x$, $R_y$] is representatively explained with reference to steps 2001 to 2013.

At step 2001, the counters "n" and "m" are initialized to "1". Then, the following calculations are performed:

$$X(n) \leftarrow (i-1)(A+a)-(n-1)C$$

$$Y(m) \leftarrow (m-1)C-(i-1)b$$

These calculations are based on the above-mentioned equations (1) and (2). Namely, when the DMD unit $18_1$ reaches an $i^{th}$ exposure-operation position, both the X component x(n) and the Y component y(m) of X-Y coordinates $P_{[x(n),y(m)]}$ of a center locus $CN_{(n,m)}$ are calculated (FIG. 14). Of course, if n=1, m=1, and i=1, the X-Y coordinates $P_{[(1)=0,y(1)=0]}$ represents the center loci $CN_{(1,1)}$ of the unit exposure zones $U_{(1,1)}$ at the first exposure-operation position.

At step 2003, it is determined whether the X component x(n) is equal to or more than "0". If x(n)≧0, the control proceeds to step 2004, in which it is determined whether the Y component y(m) is equal to or more than "0". If x(n)≧0, and if y(m)≧0, the X-Y coordinates $P_{[x(n),y(m)]}$ concerned rests on or crosses beyond the lateral leading boundary of the circuit pattern drawing area (DA), i.e. the X-Y coordinates $P_{[x(n),y(m)]}$ is encompassed by the circuit pattern drawing area (DA). At step 2004, if y(m)<0, the control proceeds to step 2005, in which it is determined whether an absolute value of the Y component y(m) is equal to or less than a dimension "$P_s$" of a pixel-dot area(10×10 μm, 20×20 μm, 30×30 μm, 40×40 μm) If |y(m)|≦$P_s$, the X-Y coordinates $P_{[x(n),y(m)]}$ concerned do not cross beyond a left side boundary ($BO_{10}$, $BO_{20}$, $BO_{30}$, $BO_{40}$) of the circuit pattern drawing area (DA).

In short, at steps 2003, 2004, and 2005, it is determined whether the calculated X-Y coordinates $P_{[x(n),y(m)]}$ is completely included in the circuit pattern drawing area (DA). When the X-Y coordinates $P_{[x(n),y(m)]}$ are completely included in the circuit pattern drawing area (DA), the control proceeds to step 2006, in which the following calculations are performed:

$$L_x \leftarrow INT[x(n)/P_s]+1$$

$$R_y \leftarrow INT[y(m)/P_s]+1$$

These calculations are based on the above-mentioned equations (3) and (4). Namely, the calculated results represent the address data [$L_x$, $R_y$] for identifying a bit-datum "B", based on which the micro-mirror element, corresponding to the calculated X-Y coordinates $P_{[x(n),y(m)]}$, should be operated.

At step 2007, the calculated address data [$L_x$, $R_y$] is stored in the memory area $AD18_1$ of the address data memory 54. Then, the control proceeds to step 2008. On the other hand, if the X-Y coordinates $P_{[x(n),y(m)]}$ concerned are not included in the circuit pattern drawing area (DA), i.e. if x(n)<0 (step 2003) or if |y(m)|<0 (step 2005), the control proceeds to step 2008.

At step 2008, it is determined whether the count value of the counter "m" has reached the maximum value of "1280". If m<1280, the control proceeds to step 2009, in which the count value of the counter "m" is incremented by "1". Then, the control returns to step 2002. Thus, the routine comprising steps 2002 to 2009 is repeatedly executed until the count value of the counter "m" reaches the maximum value of "1280". Namely, is successively calculated the address data [$L_x$, $R_y$] for identifying the first line of 1280 bit-data "B" in the first group (1st. G) of the bit-map memory 52 (FIG. 11).

At step 2008, when the count value of the counter "m" reaches the maximum value of "1280", i.e. when the calculation of the address data [$L_x$, $R_y$] for identifying the first line of 1280 bit-data "B" is completed, the control proceeds to step 2010, in which the counter "m" is initialized to "1". Then, at step 2011, it is determined whether the count value of the counter "n" has reached the maximum value of "1024". If n<1024, the control proceeds to step 2012, in which the count value of the counter "n" is incremented by "1". Then, the control returns to step 2002.

Namely, the routine comprising steps 2002 to 2009 is repeatedly executed again until the count value of the counter "m" reaches the maximum value of "1280", and is successively calculated the address data [$L_x$, $R_y$] for identifying the second line of 1280 bit-data "B" in the first group (1st. G) of the bit-map memory 52 (FIG. 11)

At step 2011, when the count value of the counter "n" reaches the maximum value of "1024", i.e. when the calculation of the address data [$L_x$, $R_y$] for identifying all the 1024 lines of 1280 bit-data "B" are completed, the control proceeds to step 2013, in which the counter "n" is initialized to "1".

Then, at step 2014, the address data [$L_x$, $R_y$] for the remaining DMD units $18_2$ to $18_8$ and $20_1$ to $20_7$ are calculated in substantially the same manner as mentioned above. Namely, in the calculation of the address data [$L_x$, $R_y$] for the DMD units $18_2$ to $18_8$, it is taken into consideration that each of the remaining DMD units $18_2$ to $18_8$ is spaced from the DMD unit $18_1$ by the given distance in the plus direction of the Y-axis of the X-Y coordinate system. Similarly, in the calculation of the address data [$L_x$, $R_y$] for the DMD units $20_1$ to $20_7$, it is taken into consideration that not only is each of the DMD units $20_1$ to $20_7$ spaced from the DMD unit $18_1$ by the given distance in the plus direction of the Y-axis of the X-Y coordinate system, but also it is spaced from the DMD unit $18_1$ by the given distance in the movement direction AR of the drawing table 14.

In the aforementioned embodiment, although the drawing table 14 is intermittently moved at the regular intervals of "A+a" during the drawing operation, it is possible to draw a circuit pattern on the drawing surface 32 by continuously moving the drawing table 14 at a constant velocity, provided that an exposure time is set at a shorter time than the time during which the drawing table 14 is moved by the dimension (20 μm) of the size of an unit exposure zone.

Figure 21:
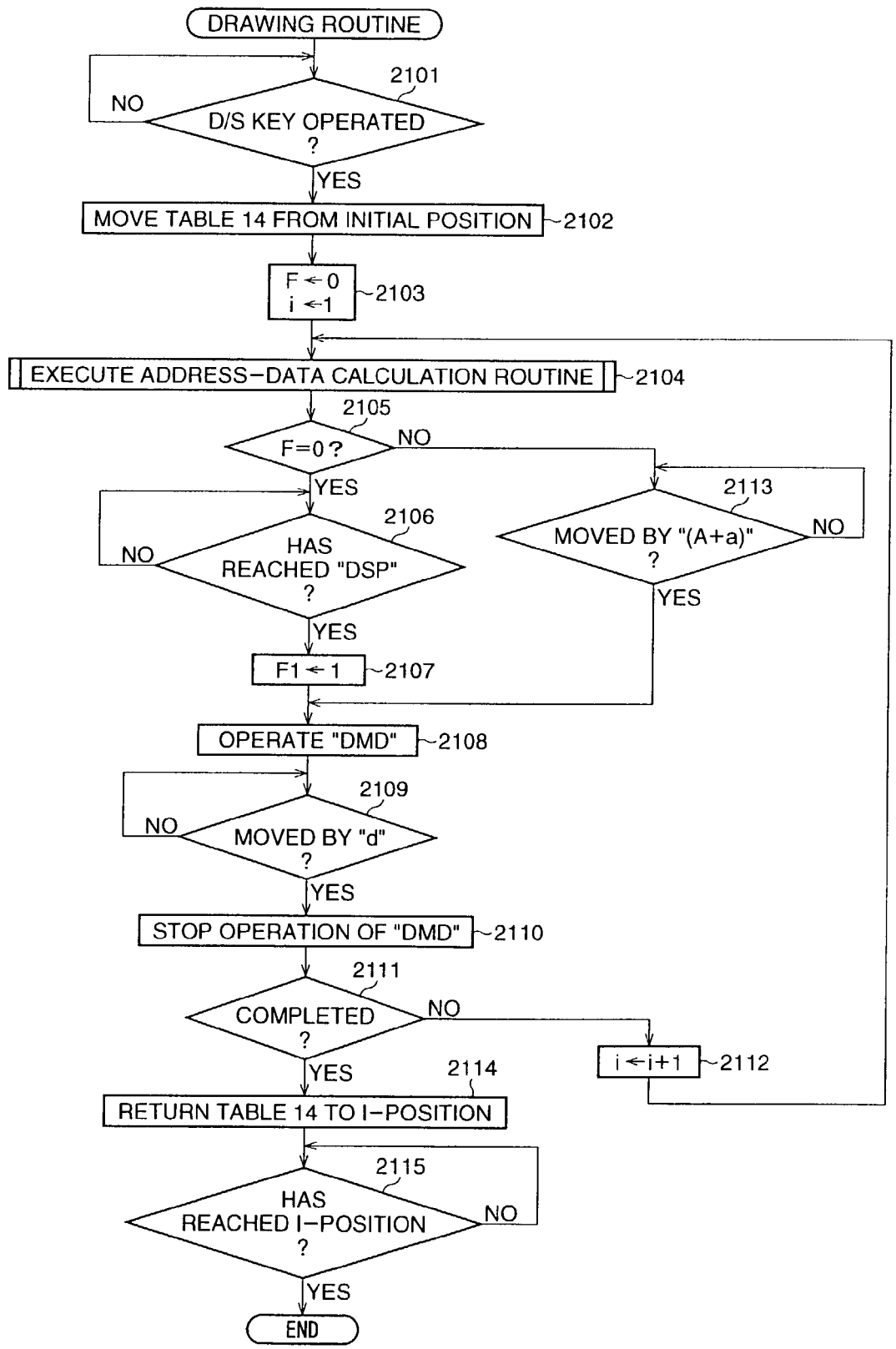
FIG. 21 is a flowchart of another drawing routine executed in a system control circuit of the multi-exposure drawing apparatus.

FIG. 21 shows a flowchart of a drawing routine executed in the system control circuit 34 when the drawing table 14 is continuously moved in the movement direction AR. Note, the constant velocity of the drawing table 14 is suitably selected based on the size of the pixel-dot area, the sensitivity of the photoresist layer, the light intensity of the light beam 22, and so on, so that a proper exposure level can be obtained for the pixel-dot area. The execution of the drawing routine is also started by turning ON the power ON/OFF switch (not shown) of the apparatus.

Note, similar to the drawing routine of FIG. 19, it is supposed that various data (e.g. distance data "A" "a", and "b", exposure time data, velocity data for the drawing table 14, and so on) necessary to execute the drawing routine are already input to the RAM of the system control circuit 34 through the keyboard 48.

At step 2101, it is monitored whether a drawing-start key on the keyboard 48 has been operated. When the operation of the drawing-start key is confirmed, the control proceeds to step 2102, in which the stepping motor 36 is driven so that the drawing table 14 is moved from an initial or home position toward the bridge-like structure 16 in the movement direction AR.

At step 2103, a flag F is initialized to "0", and a counter "i" is initialized to "1". The functions of the flag F and the counter "i" are substantially the same as in the drawing routine of FIG. 19.

At step 2104, the address-data calculation routine (FIG. 20) is executed as already stated above. Then, at step 2105, it is determined whether the flag F is "0" or "1". At this initial stage, since F=0, the control proceeds to step 2106, in which it is monitored whether the workpiece on the drawing table 14 has reached the drawing-start position (DSP) or first exposure-operation position.

When the arrival of the workpiece at the first exposure-operation position is confirmed, the control proceeds to step 2107, in which the flag F is changed from "0" to "1". Then, at step 2108, the address data [$L_x$, $R_y$], obtained by the execution of the address-data calculation routine (step 2104), are output from the address data memory 54 to the bit-map memory 52, and thus the bit-data "B", identified by address data [$L_x$, $R_y$], are output from the bit-map memory 52 to the DMD driver circuit 56, whereby the DMD units ($18_1$ to $18_8$, and $20_1$ to $20_7$) are operated based on the bit-data "B" output from the bit-map memory 52.

At step 2109, it is monitored whether the drawing table 14 is moved by a distance "d" from the first exposure-operation position. Note, the distance "d" is smaller than the dimension (20 μm) of the size of the micro-mirror element, and is previously input as the exposure time data to the RAM of the system control circuit 34 through the keyboard 48.

At step 2109, when the movement of the drawing table 14 by the distance "d" is confirmed, the control proceeds to step 2110, in which the operation of the DMD units ($18_1$ to $18_8$, and $20_1$ to $20_7$) is stopped. Then, at step 2111, it is determined whether the drawing of the circuit pattern has been completed.

At step 2111, when the completion of the drawing of the circuit pattern is not confirmed, the control proceeds to step 2112, in which the count value of the counter "i" is incremented by "1", and the control returns to step 2104.

At step 2104, the address-data calculation routine is again executed to calculate address data [$L_x$, $R_y$] for bit-data "B" to be read from the bit-map memory 52 when an exposure operation is performed at the second exposure-operation position (i=2). Then, at step 2105, it is determined whether the flag F is "0" or "1". At this stage, since F=1, the control proceeds from step 2105 to step 2113, in which it is monitored whether the drawing table 14 is moved by the distance "A+a".

At step 2113, when the movement of the drawing table 14 by the distance "A+a" is confirmed, the control proceeds from step 2113 to step 2108, in which the address data [$L_x$, $R_y$], obtained by the execution of the address-data calculation routine (step 2104, i=2), output from the address data memory 54 to the bit-map memory 52, and thus the bit-data "B", identified by address data [$L_x$, $R_y$], are output from the bit-map memory 52 to the DMD driver circuit 56, whereby the DMD units ($18_1$ to $18_8$, and $20_1$ to $20_7$) are operated based on the bit-data "B" output from the bit-map memory 52. Namely, whenever the drawing table 14 is moved by the distance "A+a", the exposure operation is repeated until the drawing of the circuit pattern is completed (step 2111).

At step 2111, when the completion of the drawing of the circuit pattern is confirmed, the control proceeds to step 2114, in which the stepping motor 36 is reversely driven, thereby moving the drawing table 14 toward the initial or home position. Then, at step 2115, it is monitored whether the drawing table 14 has returned to the initial or home position. When the return of the drawing table 14 to the initial or home position is confirmed, the routine ends.

As is apparent from the foregoing, according to the present invention, it is possible to draw a circuit pattern in a multi-exposure manner with different pixel sizes, without preparing several types of drawing apparatuses.

In the aforesaid embodiments, although a pixel size of the circuit pattern data has the two dimensions which are equal to each other (10×10 μm, 20×20 μm, 30×30 μm, 40×40 μm), the two dimensions of the pixel size may be different from each other. For example, the dimensions of the pixel size may be 20×30 μm, provided that the aforesaid equations (1) and (2) are somewhat modified. Namely, when the respective two dimensions of the pixel size, measured along the X-axis and Y-axis of the X-Y coordinate system, are represented by "$C_x$" and "$C_y$" ($C_x \neq C_y$), the equations (1) and (2) are modified as follows:

$$X(n) = (i-1)(A+a) - (n-1)C_x \quad (1)$$

$$Y(m) = (m-1)C_y - (i-1)b \quad (2)$$

As stated hereinbefore, although the fifteen optical fiber cables are used to introduce the light beam from the light source device 22 to the fifteen DMD units $18_1$ to $18_8$ and $20_1$ to $20_7$, another optical element may be substituted for the optical fiber cable. For example, as shown in FIG. 22, it is possible to use a set of fifteen mirror elements $230_{01}$ to $230_{15}$, for the introduction of the light beam from the light source device 22 to the fifteen DMD units $18_1$ to $18_8$, and $20_1$ to $20_7$.

Figure 22:
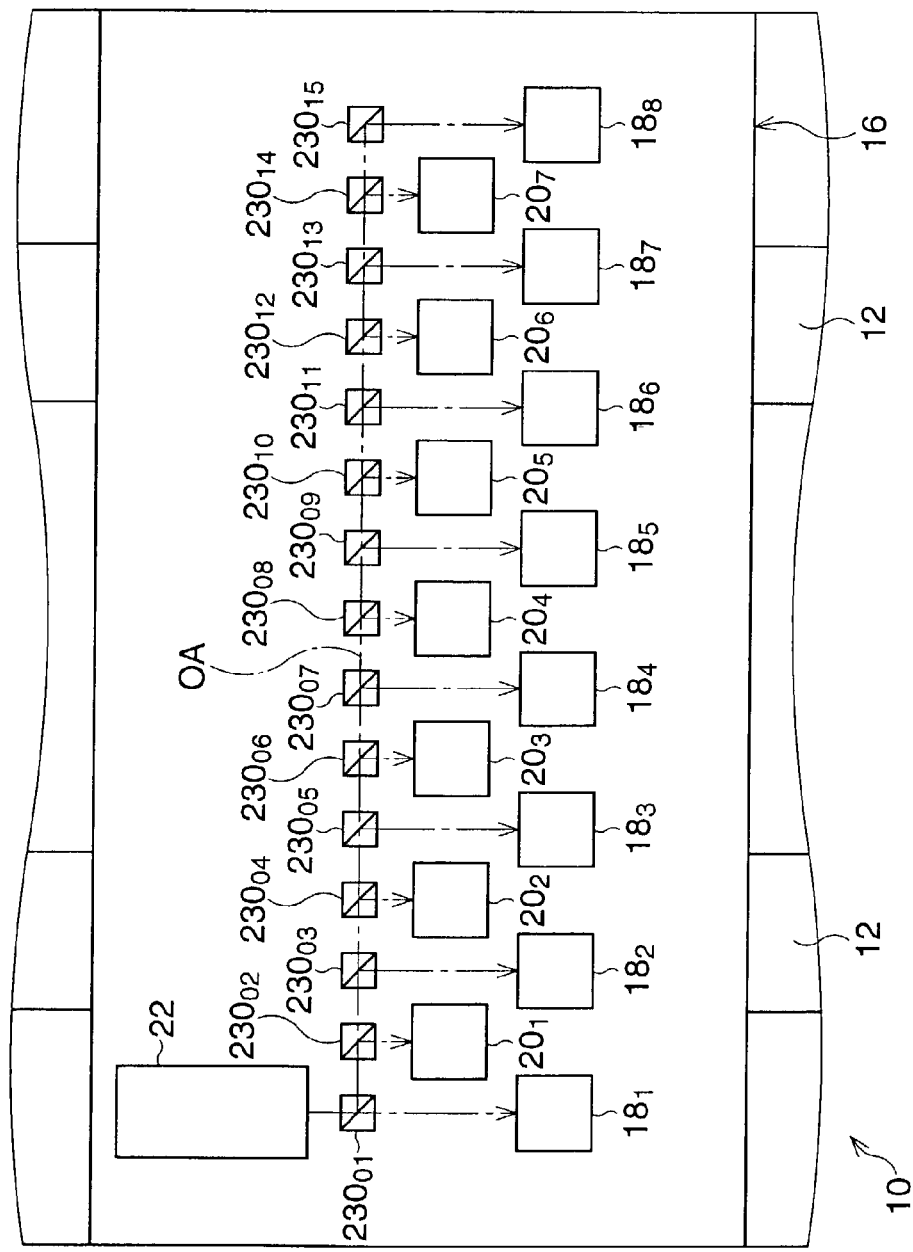
FIG. 22 is a partial plane view showing an arrangement of fifteen mirror elements for introducing a light beam from a light source device into fifteen DMD units.

In particular, as shown in FIG. 22, the mirror elements $230_{01}$ to $230_{15}$ are aligned with each other along an optical axis OA, which is parallel to the alignments of both the DMD units $18_1$ to $18_1$ and the DND units $20_1$ to $20_7$, and each of the mirror elements $230_{01}$, to $230_{15}$ is positioned to define an angle of 45° with respect to the optical axis OA. Each of the fourteen mirror elements $230_{01}$ to $230_{14}$ is formed as a beam splitter, and the remaining mirror element $230_{15}$ is formed as a total reflecting mirror.

In the embodiment shown in FIG. 22, the light source device 22 is arranged such that the light-beam-emitting port of the light source device is aligned with the light-beam-receiving port of the DMD unit $18_1$, and the beam splitter $230_1$, intervenes between the light-beam-emitting port and the light-beam-receiving port. The beam splitter $230_1$ is constituted such that one-fifteenth of the light beam, emitted from the light source device 22, penetrates the beam splitter $230_1$. Namely, the remaining part (14/15) of the light beam is reflected by the beam splitter $230_1$ so as to be directed to the adjacent beam splitter $230_2$. In all cases, the transmission efficiencies of the beam splitters $230_2$ to $230_{14}$ are regulated such that one-fifteenth of the light beam, emitted from the light source device 22, is introduced by each beam splitter ($230_2, \ldots, 230_{14}$) into a corresponding DMD unit ($18_2, \ldots, 18_8; 20_1, \ldots, 20_6$). Note, the total reflecting mirror $230_{15}$ is used to reflect the light, beam passing through the beam splitter $230_{14}$, toward the DMD unit $18_8$.

Figure 23:
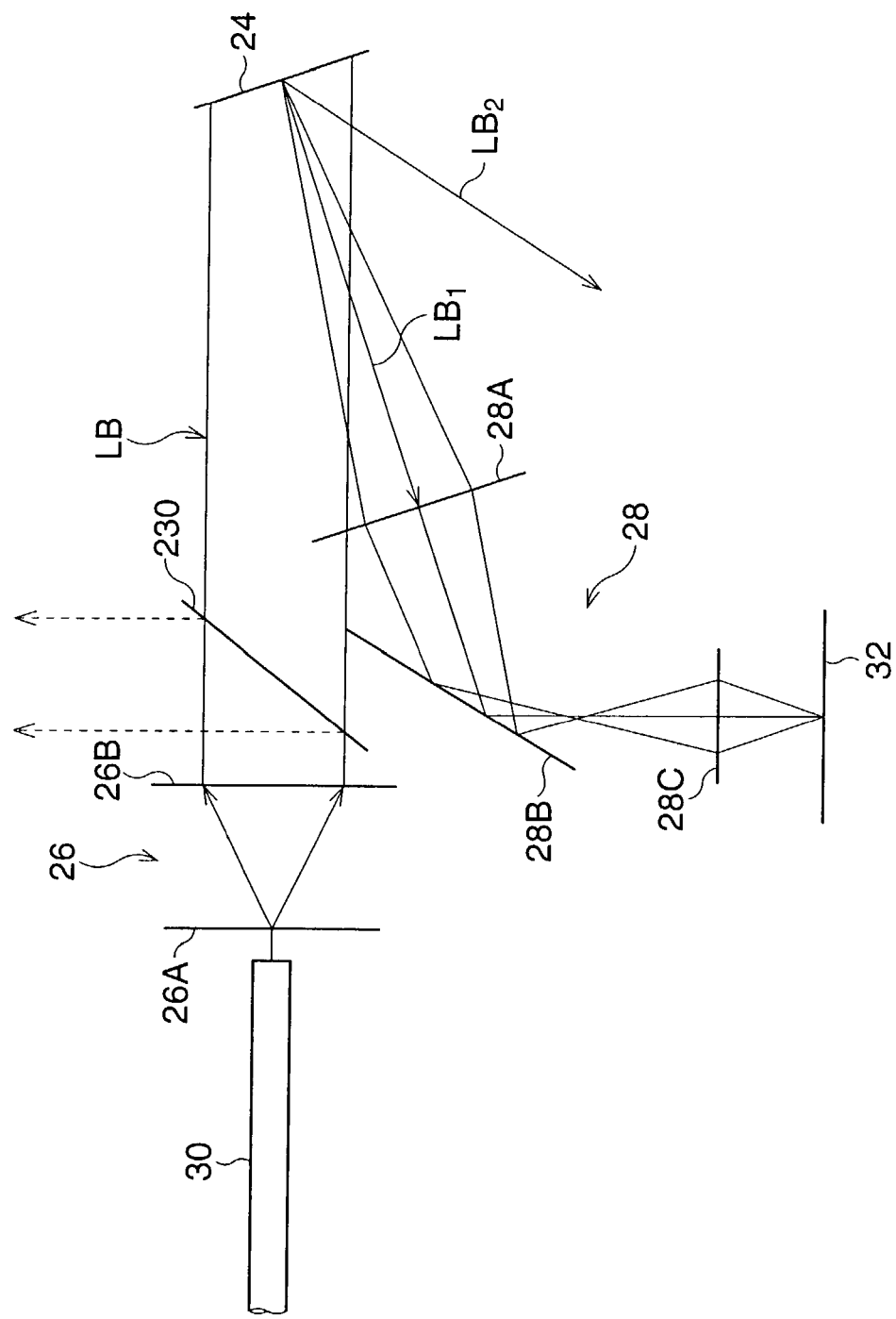
FIG. 23 is a conceptual view, similar to FIG. 2, showing a situation in which a mirror element or beam splitter is assembled in the interior of the DMD unit.

Each of the fourteen beam splitters $230_{01}$ to $230_{14}$ may be incorporated in an interior of a corresponding DMD unit. Namely, as shown in FIG. 23, a beam splitter, representatively indicated by reference 230, may be provided between the reflecting surface of the DMD unit and the collimating lens 26B. Of course, the DMD unit must be provided with a light-beam-exit port for introducing the reflected part into the adjacent DMD unit through, for example, an optical fiber cable.

According to the present invention, although any one of the optical modulation elements of the exposure unit may malfunction, it is possible to properly carry out the drawing of the circuit pattern, without exchanging the exposure unit for a new one, because a pixel-dot area is produced on the drawing surface in the multi-exposure manner, using a plurality of different modulation elements or micro-mirror elements. Also, although light beams reflected from the different modulation elements or micro-mirror elements have somewhat uneven intensities, it is possible to draw a circuit pattern on the drawing surface at a uniform exposure level, for the same reasons as mentioned above.

Further, when the drawing table is continuously moved during the drawing operation, it is unnecessary to frequently repeat acceleration and deceleration of the drawing table, and thus the drive mechanism for driving the drawing table 14 is not susceptible to damage.

Finally, it will be understood by those skilled in the art that the foregoing description is of a preferred embodiment of the system, and that various changes and modifications may be made to the present invention without departing from the spirit and scope thereof.

The disclosure relates to subject matters contained in Japanese Patent Applications No. 2001-204550 (filed on Jul. 5, 2001) and No. 2001-278031 (filed on Sep. 13, 2001) which are expressly incorporated herein, by reference, in their entirety.

The invention claimed is:

1. A multi-exposure drawing method for drawing a pattern on a drawing surface, using an exposure unit including a plurality of optical modulation elements arranged in both a first array-direction and a second array-direction, the method comprising:

relatively moving said exposure unit in relation to said drawing surface in a drawing direction, which is inclined so as to form an angle with respect to said first array-direction, whereby said exposure unit is gradually shifted in said second array-direction during the movement of said exposure unit; and repeatedly and selectively operating said optical modulation elements whenever said exposure unit is moved in said drawing direction such that a movement distance of a unit exposure zone along the first array-direction becomes "A+a", and a movement distance of said unit exposure zone along the second array-direction becomes "b", defined as follows:

"A" is a distance corresponding to an integer-multiple of a dimension of said unit exposure zone produced on said drawing surface by each optical modulation element, and "a" is a smaller distance than the dimension of said unit exposure zone, wherein said exposure unit is continuously moved at a constant velocity, and the modulation of said light beam by said optical modulation elements is performed whenever said unit exposure zone is shifted by said distance of "A+a", a time of said modulation being shorter than a time during which said exposure unit is moved by the dimension of said unit exposure zone.

2. A multi-exposure drawing method as set forth in claim 1, wherein said angle is defined such that said unit exposure zone is shifted by the distance "b" in the second array-direction when the relative movement of said unit exposure zone is performed by said distance of "A+a", and the dimension of said unit exposure zone is completely divisible by said distance "a".

3. A multi-exposure drawing method as set forth in claim 1, wherein said angle is defined such that said unit exposure zone is shifted by the distance "b" in the second array-direction when the relative movement of said unit exposure zone is performed by said distance of "A+a", and the dimension of said unit exposure zone is indivisible by said distance "a".

4. A multi-exposure drawing apparatus that draws a pattern on a drawing surface, using an exposure unit including a plurality of optical modulation elements arranged in both a first array-direction and a second array-direction, which comprises:
   a movement system that moves said exposure unit in relation to said drawing surface in a drawing direction, which is inclined so as to form an angle with respect to said first array-direction, whereby said exposure unit is gradually shifted in said second array-direction during the movement of said exposure unit; and
   a modulation system that operates repeatedly and selectively said optical modulation elements whenever said exposure unit is moved in said drawing direction such that a movement-distance of a unit exposure zone along the first array-direction becomes "A+a", and a movement-distance of said unit exposure zone along the second array-direction becomes "b", defined as follows:
   "A" is a distance corresponding to an integer-multiple of a dimension of said unit exposure zone produced on said drawing surface by each optical modulation element, and
   "a" is a smaller distance than the dimension of said unit exposure,
   wherein said movement system includes a control system that continuously moves said exposure unit at a constant velocity during a drawing operation, and said modulation system includes a control system that controls the modulation of said light beam by said optical modulation elements such that said modulation is performed whenever said unit exposure zone is shifted by said distance of "A+a", a time of said modulation being shorter than a time during which said exposure unit is moved by the dimension of said unit exposure zone.

5. A multi-exposure drawing apparatus as set forth in claim 4, wherein said modulation system includes an optical focussing system that produces said unit exposure zone on said drawing surface with the modulated light beam so as to be a same size as that of the corresponding optical modulation element.

6. A multi-exposure drawing apparatus as set forth in claim 4, further comprising an exposure system including:
   a plurality of exposure units which are transversely aligned with each other with respect to said drawing direction;
   a light source system that emits a light beam for an exposure operation; and
   a light-beam distribution system provided between said plurality of exposure units and said light source system such that said light beam, emitted from said light source system, is uniformly distributed to said exposure units.

7. A multi-exposure drawing apparatus as set forth in claim 6, wherein said light-beam distribution system includes a plurality of mirror elements, which are arranged such that the uniform distribution of said light beam to said exposure units is carried out.

8. A multi-exposure drawing apparatus as set forth in claim 7, wherein each of said mirror elements is formed as a beam splitter, and said light beam is successively split into light beams by said beam splitters such that the split light beams are distributed to the exposure units, individual transmission efficiencies of said beam splitters being regulated such that the uniform distribution of said light beam to said exposure units is carried out.

9. A multi-exposure drawing apparatus as set forth in claim 8, wherein each of said beam splitters is provided at an exterior of a corresponding exposure unit.

10. A multi-exposure drawing apparatus as set forth in claim 8, wherein each of said beam splitters is assembled in an interior of a corresponding exposure unit.

11. A multi-exposure drawing apparatus as set forth in claim 4, wherein said angle is defined such that said unit exposure zone is shifted by the distance "b" in the second array-direction when the relative movement of said unit exposure zone is performed by said distance of "A+a", and the dimension of said unit exposure zone is completely divisible by said distance "a".

12. A multi-exposure drawing apparatus as set forth in claim 4 wherein, said angle is defined such that said unit exposure zone is shifted by the distance "b" in the second array-direction when the relative movement of said unit exposure zone is performed by said distance of "A+a", and the dimension of said unit exposure zone is indivisible by said distance "a".

13. A multi-exposure drawing method for drawing a pattern on a drawing surface, using an exposure unit including a plurality of optical modulation elements arranged in both a first array-direction and a second array-direction, the method comprising:
   relatively moving said exposure unit in relation to said drawing surface in a drawing direction, which is inclined so as to form an angle with respect to said first array-direction, whereby said exposure unit is gradually shifted in said second array-direction during the movement of said exposure unit; and
   repeatedly and selectively operating said optical modulation elements whenever said exposure unit is moved in said drawing direction such that a movement distance of a unit exposure zone along the first array-direction becomes "A+a", and a movement distance of said unit exposure zone along the second array-direction becomes "b", defined as follows:
   "A" is a distance corresponding to an integer-multiple of a dimension of said unit exposure zone produced on said drawing surface by each optical modulation element, wherein "A+a" is a distance equal to or larger than double the dimension of said unit exposure zone, and
   "a" is a smaller distance than the dimension of said unit exposure zone.

14. A multi-exposure drawing method as set forth in claim 13, wherein said angle is defined such that said unit exposure zone is shifted by the distance "b" in the second array-direction when the relative movement of said unit exposure zone is performed by said distance of "A+a", and the dimension of said unit exposure zone is completely divisible by said distance "a".

15. A multi-exposure drawing method as set forth in claim 13, wherein said angle is defined such that said unit exposure zone is shifted by the distance "b" in the second array-direction when the relative movement of said unit exposure zone is performed by said distance of "A+a", and the dimension of said unit exposure zone is indivisible by said distance "a".

16. A multi-exposure drawing method as set forth in claim 13, wherein the relative movement of said exposure unit is stopped whenever said unit exposure zone is shifted by said distance of "A+a", and the modulation of said light beam by said optical modulation elements is performed during the stoppage of said exposure unit.

17. A multi-exposure drawing method as set forth in claim 13, wherein said exposure unit is continuously moved at a constant velocity, and the modulation of said light beam by said optical modulation elements is performed whenever said unit exposure zone is shifted by said distance of "A+a", a time of said modulation being shorter than a time during which said exposure unit is moved by the dimension of said unit exposure zone.

* * * * *